United States Patent
Bi et al.

(10) Patent No.: US 10,404,234 B2
(45) Date of Patent: Sep. 3, 2019

(54) FILTER DEVICE WITH PHASE COMPENSATION, AND ELECTRONIC DEVICES INCLUDING SAME

(71) Applicant: SKYWORKS FILTER SOLUTIONS JAPAN CO., LTD., Kadoma-Shi (JP)

(72) Inventors: Zhiqiang Bi, Shrewsbury, MA (US); Rei Goto, Osaka (JP); Chun Sing Lam, San Jose, CA (US); Tetsuya Tsurunari, Neyagawa (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 86 days.

(21) Appl. No.: 15/691,342

(22) Filed: Aug. 30, 2017

(65) Prior Publication Data

US 2018/0069529 A1    Mar. 8, 2018

Related U.S. Application Data

(60) Provisional application No. 62/462,172, filed on Feb. 22, 2017, provisional application No. 62/383,024, filed on Sep. 2, 2016.

(51) Int. Cl.
*H03H 9/64* (2006.01)
*H03H 9/145* (2006.01)
(Continued)

(52) U.S. Cl.
CPC ...... *H03H 9/6483* (2013.01); *H03H 9/14547* (2013.01); *H03H 9/14561* (2013.01);
(Continued)

(58) Field of Classification Search
CPC ........ H03H 9/725; H03H 9/54; H03H 9/6483; H03H 9/68; H03H 9/02992; H03H 9/14547; H03H 9/14561
(Continued)

(56) References Cited

U.S. PATENT DOCUMENTS

| 4,799,029 A | 1/1989 | Minomo |
| 4,906,885 A | 3/1990 | Kojima et al. |

(Continued)

FOREIGN PATENT DOCUMENTS

| JP | S62261211 A | 11/1987 |
| JP | H09312587 A | 12/1997 |

(Continued)

*Primary Examiner* — Rakesh B Patel
*Assistant Examiner* — Jorge L Salazar, Jr.
(74) *Attorney, Agent, or Firm* — Lando & Anastasi, LLP

(57) ABSTRACT

Phase shift circuits including two or more slanted-finger IDT electrodes, and filters, duplexers, or other electronic devices incorporating same. In one example a filter includes a main filter circuit connected between an input and an output and having a first phase characteristic, and a phase shift circuit connected in parallel with the main filter circuit, the phase shift circuit including first and second capacitor elements and a pair of acoustic wave elements connected in series between the first and second capacitor elements, the pair of acoustic wave elements including a pair of slanted-finger IDT electrodes disposed apart from each other on a single acoustic wave path along which acoustic waves propagate through the acoustic wave elements, the phase shift circuit having a second phase characteristic opposite to the first phase characteristic in an attenuation band that corresponds to at least a portion of a stopband of the main filter circuit.

18 Claims, 22 Drawing Sheets

(51) Int. Cl.
  *H03H 9/72* (2006.01)
  *H03H 9/68* (2006.01)
  *H03H 9/54* (2006.01)
  *H03H 9/02* (2006.01)

(52) U.S. Cl.
  CPC .............. *H03H 9/54* (2013.01); *H03H 9/68* (2013.01); *H03H 9/725* (2013.01); *H03H 9/02992* (2013.01)

(58) Field of Classification Search
  USPC .......................................... 333/133, 193–196
  See application file for complete search history.

(56) References Cited

U.S. PATENT DOCUMENTS

| | | |
|---|---|---|
| 5,666,091 A | 9/1997 | Hikita et al. |
| 5,682,126 A | 10/1997 | Plesski et al. |
| 5,864,262 A | 1/1999 | Ikada |
| 5,905,418 A | 5/1999 | Ehara et al. |
| 5,994,980 A | 11/1999 | Tada |
| 6,049,260 A | 4/2000 | Yoshimoto et al. |
| 6,262,637 B1 | 7/2001 | Bradley et al. |
| 6,404,302 B1 | 6/2002 | Satoh et al. |
| 6,677,835 B2 | 1/2004 | Noguchi et al. |
| 7,084,718 B2 | 8/2006 | Nakamura et al. |
| 7,733,196 B2 | 6/2010 | Tsurunari et al. |
| 7,941,103 B2 | 5/2011 | Iwamoto et al. |
| 8,174,339 B2 | 5/2012 | Matsuda et al. |
| 8,228,137 B2 | 7/2012 | Inoue et al. |
| 8,378,760 B2 | 2/2013 | Iwaki et al. |
| 8,618,992 B2 | 12/2013 | Fujiwara et al. |
| 9,118,303 B2 | 8/2015 | Inoue |
| 9,219,467 B2 | 12/2015 | Inoue et al. |
| 9,246,533 B2 | 1/2016 | Fujiwara et al. |
| 2004/0130411 A1 | 7/2004 | Beaudin et al. |
| 2004/0246077 A1 | 12/2004 | Misu et al. |
| 2007/0024392 A1 | 2/2007 | Inoue et al. |
| 2007/0090895 A1 | 4/2007 | Nishizawa et al. |
| 2008/0238572 A1 | 10/2008 | Funami et al. |
| 2010/0026419 A1 | 2/2010 | Hara et al. |
| 2010/0102901 A1* | 4/2010 | Tsuda ................. H03H 9/02716 333/195 |
| 2010/0109802 A1 | 5/2010 | Tanaka |
| 2010/0150075 A1 | 6/2010 | Inoue et al. |
| 2010/0194494 A1 | 8/2010 | Inoue et al. |
| 2011/0199169 A1 | 8/2011 | Kadota |
| 2011/0254639 A1 | 10/2011 | Tsutsumi et al. |
| 2012/0119847 A1 | 5/2012 | Iwaki et al. |
| 2013/0113576 A1 | 5/2013 | Inoue et al. |
| 2013/0147578 A1* | 6/2013 | Hara .................... H03H 9/605 333/133 |
| 2013/0214873 A1 | 8/2013 | Takamine |
| 2014/0113571 A1* | 4/2014 | Fujiwara ................. H04B 1/40 455/73 |
| 2015/0171827 A1* | 6/2015 | Kawasaki .......... H03H 9/14558 333/133 |
| 2016/0105158 A1 | 4/2016 | Fujiwara et al. |
| 2017/0093373 A1 | 3/2017 | Fujiwara et al. |
| 2017/0099043 A1 | 4/2017 | Goto et al. |
| 2017/0331456 A1 | 11/2017 | Ono |

FOREIGN PATENT DOCUMENTS

| | | |
|---|---|---|
| JP | 2002158599 A | 5/2002 |
| JP | 2004242280 A | 8/2004 |
| JP | 2006311041 A | 11/2006 |
| JP | 2007124085 A | 5/2007 |
| JP | 2010041141 A | 2/2010 |
| JP | 2010154437 A | 7/2010 |
| JP | 2011160203 A | 8/2011 |
| JP | 2012109818 A | 6/2012 |
| JP | 2013-048491 A | 3/2013 |
| JP | 2013118611 A | 6/2013 |
| WO | 2009025106 A1 | 2/2009 |
| WO | 2010073377 A1 | 7/2010 |

* cited by examiner

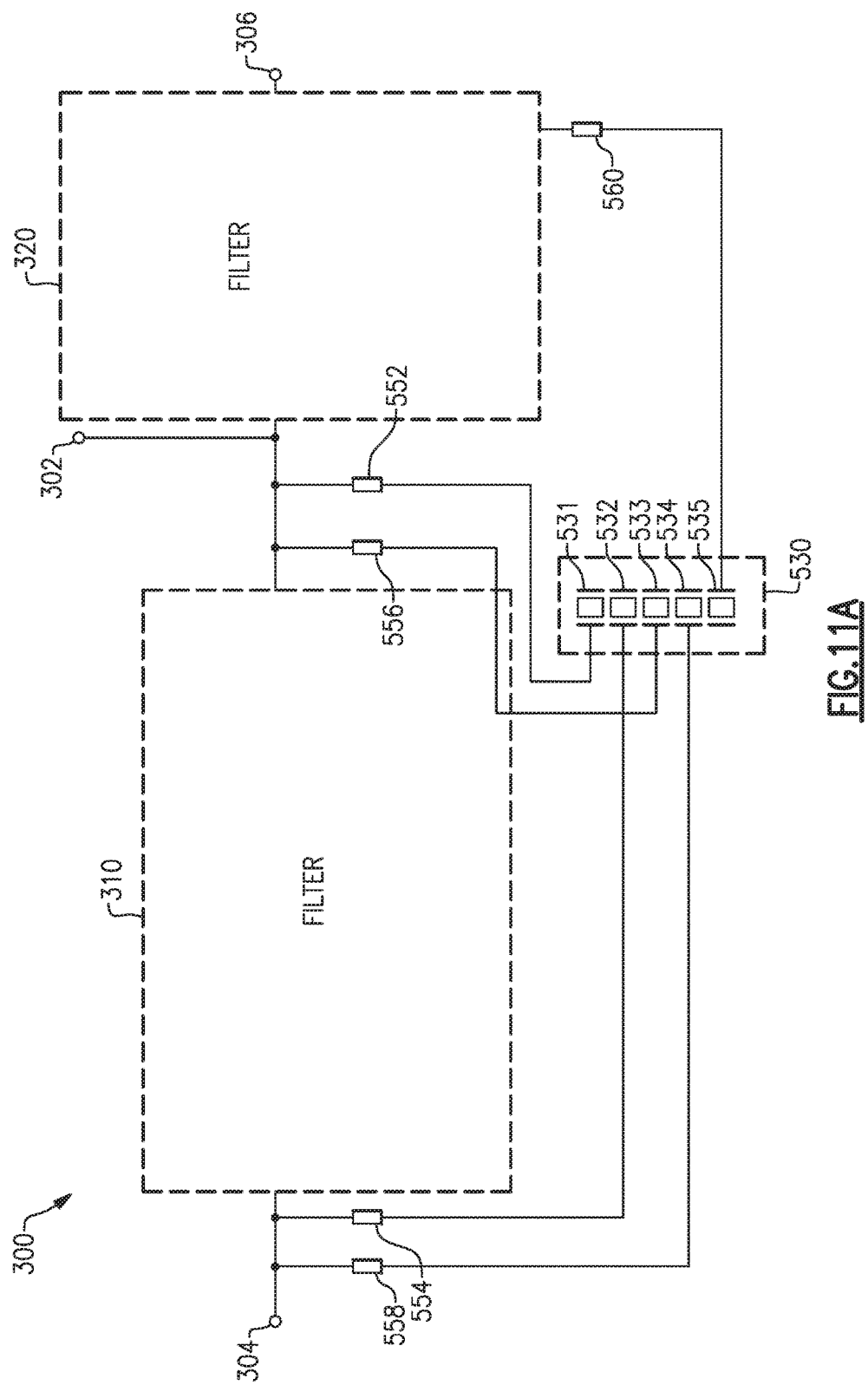

FILTER DEVICE WITH PHASE COMPENSATION, AND ELECTRONIC DEVICES INCLUDING SAME

CROSS-REFERENCE TO RELATED APPLICATIONS

This application claims the benefit under 35 U.S.C. § 119(e) of U.S. Provisional Application No. 62/383,024 titled "FILTER DEVICE WITH PHASE COMPENSATION, AND ELECTRONIC DEVICES INCLUDING SAME" and filed on Sep. 2, 2016, and of U.S. Provisional Application No. 62/462,172 titled "FILTER DEVICE WITH PHASE COMPENSATION, AND ELECTRONIC DEVICES INCLUDING SAME" and filed on Feb. 22, 2017, both of which are incorporated herein by reference in their entireties for all purposes.

BACKGROUND

Filters, in particular high-frequency filters, are used in a wide variety of electronic devices for many different applications and functions. One common implementation of a high-frequency filter that is used in wireless communications devices, for example, in the antenna duplexer of such devices, is a ladder-type filter such as that shown in FIG. 1. Referring to FIG. 1, the filter 100 includes input/output terminals 102 and 104, a signal line 106, one or more series arm resonators 108, and a plurality of parallel arm resonators 110. The signal line 106 is connected between the input/output terminals 102 and 104, as shown. The series arm resonator(s) 108 are connected in series with each other along the signal line 106. The parallel arm resonator(s) 110 are connected between the signal line 106 and a reference potential 112. The reference potential 112 can be ground. Together, the series arm resonators 108 and parallel arm resonators 110 form a ladder circuit and function as a band-pass filter having a passband and stopbands. In certain examples, a phase shifter 114, such as an inductor, can be included (as shown in FIG. 1) as a matching component, particularly when the filter 100 is used in an antenna duplexer.

In certain modern communications devices, such as mobile phones, for example, there is an ongoing trend to make these devices smaller, and accordingly, it can be desirable to reduce the number of components used in the communications "front end" portion (e.g., the radio frequency portion) of such devices. In the radio frequency circuit portion of certain wireless communications devices, the number of components can be reduced by reducing the number of inter-stage filters in the signal transmission and reception paths. However, this requires the antenna duplexer to have a very good isolation characteristic. As a result, it can be necessary for bandpass filters used in the antenna duplexer to have very high attenuation in the stopband(s). These design requirements can be challenging and are not met by conventional ladder-type filters.

Certain antenna duplexer designs based on ladder-type filters, such as that shown in FIG. 1, incorporate the use of a phase-influencing circuit to improve the isolation characteristic of the duplexer. For example, U.S. Pat. No. 9,246,533 discloses various examples and embodiments of electronic devices, including antenna duplexers, which incorporate an auxiliary circuit connected in parallel with a main circuit that includes one or more filters, the auxiliary circuit having a phase characteristic opposite to that of the main circuit at certain frequencies. U.S. Pat. No. 9,246,533 discloses several variations of the auxiliary circuit, which can include one or more surface acoustic wave (SAW) resonators that are formed on a piezoelectric substrate. As disclosed in U.S. Pat. No. 9,246,533, the main circuit can have a certain frequency response, also referred to as a passing characteristic, that corresponds to the passbands and stopbands of the filters included therein. The auxiliary circuit can be designed such that, within a certain frequency band, it has passing characteristic with an amplitude that is substantially similar to the amplitude of the passing characteristic of the main circuit, and a phase that opposite to the phase of the passing characteristic of the main circuit. As a result, in the certain frequency band, a main signal output from the main circuit is at least partially canceled by an auxiliary signal output from the auxiliary circuit, thereby improving the isolation characteristic of the antenna duplexer.

SUMMARY OF THE INVENTION

Aspects and embodiments relate to electronic devices including one or more filters for use in various communications apparatuses and systems.

According to one embodiment a filter includes an input terminal, an output terminal, a main filter circuit connected between the input terminal and the output terminal, and a phase shift circuit connected in parallel with the main filter circuit between the input and the output. The main filter circuit has a first phase characteristic, a first passband, and a first stopband. The phase shift circuit includes a first capacitor element, a second capacitor element, and a pair of acoustic wave elements connected in series between the first capacitor element and the second capacitor element, the pair of acoustic wave elements including a pair of slanted-finger interdigitated transducer electrodes disposed apart from each other on a single acoustic wave path along which acoustic waves propagate through the acoustic wave elements. The phase shift circuit has a second phase characteristic that is opposite to the first phase characteristic in an attenuation band that corresponds to at least a portion of the first stopband.

In one example of the filter each slanted-finger interdigitated transducer electrode includes first and second comb-shaped electrodes that interdigitate with one another, each of the first and second comb-shaped electrodes having a plurality of electrode fingers, and each electrode finger having a curved shape. In another example each slanted-finger interdigitated transducer electrode includes first and second comb-shaped electrodes that interdigitate with one another, each of the first and second comb-shaped electrodes having a busbar and a plurality of slanted electrode fingers that extend from the busbar at an angle not equal to 90 degrees.

In one example of the filter the main filter circuit includes a plurality of filter resonators, the pair of acoustic wave elements of the phase shift circuit and the plurality of filter resonators being formed on a single common piezoelectric substrate. The plurality of filter resonators of the main filter circuit may include a plurality of series arm filter resonators connected in series with one another along a signal line that connects the input terminal and the output terminal, and a plurality of parallel arm filter resonators connected between the signal line and a reference potential, the plurality of series arm filter resonators and the plurality of parallel arm filter resonators together forming a ladder-circuit. The plurality of series arm filter resonators and the plurality of parallel arm filter resonators may be surface acoustic wave resonators or bulk acoustic wave resonators, for example.

In one example the first capacitor element is connected between the pair of acoustic wave elements and the input terminal, and the second capacitor element is connected between the pair of acoustic wave elements and the output terminal, a first capacitance of the first capacitor element being smaller than a second capacitance of the second capacitor element.

The phase shift circuit may include at least one additional acoustic wave element connected in series with the pair of acoustic wave elements, the at least one additional acoustic wave element including a slanted-finger interdigitated transducer electrode.

According to another embodiment a duplexer comprises an input terminal, an output terminal, a common terminal, a filter circuit including a transmission filter connected between the input terminal and the common terminal, and a reception filter connected between the common terminal and the output terminal such that the transmission and reception filters are connected in series between the input terminal and the output terminal, and a phase shift circuit connected in parallel with the transmission filter circuit between the input terminal and the common terminal. The transmission filter has a first passband and a first stopband, and the reception filter has a second passband different from the first passband and at least partially overlapping the first stopband. The phase shift circuit includes a first capacitor element, a second capacitor element, a first slanted-finger interdigitated transducer electrode, and a second slanted-finger interdigitated transducer electrode. The phase shift circuit has a first phase characteristic that is opposite to a second phase characteristic of the transmission filter in an attenuation band, the attenuation band being within the first stopband and within the second passband.

In one example of the duplexer the first and second slanted-finger interdigitated transducer electrodes are disposed on a piezoelectric substrate spaced apart from each other along a single acoustic wave path along which acoustic waves propagate through the first and second slanted-finger interdigitated transducer electrodes. The transmission filter may include a plurality of filter resonators disposed on the piezoelectric substrate. In one example the plurality of filter resonators includes a plurality of series arm filter resonators connected in series with one another along a signal line that connects the input terminal and the common terminal, and a plurality of parallel arm filter resonators connected between the signal line and a reference potential, the plurality of series arm filter resonators and the plurality of parallel arm filter resonators together forming a ladder-circuit. The reference potential may be ground, for example.

In one example of the duplexer the first capacitor element is connected between the first slanted-finger interdigitated transducer electrode and the input terminal and the second capacitor element is connected between the second slanted-finger interdigitated transducer electrode and the output terminal. In one example a first capacitance of the first capacitor element is smaller than a second capacitance of the second capacitor element.

In another example the duplexer further comprises an inductor connected between the common terminal and a ground.

In another example of the duplexer the phase shift circuit further includes a third slanted-finger interdigitated transducer.

Another embodiment is directed to a wireless device comprising an example of the duplexer, an antenna connected to the common terminal of the duplexer, a transmitter circuit connected to the input terminal of the duplexer, and a receiver circuit connected to the output terminal of the duplexer. The transmitter circuit is configured to generate a transmit signal for transmission by the antenna, the transmit signal having a frequency within the first passband.

According to another embodiment an electronic device includes an input terminal, an output terminal, a first filter connected between the input terminal and the output terminal, and a phase shift circuit connected in parallel with the first filter between the input terminal and the output terminal. The first filter has a first passband, a first stopband, and a first phase characteristic. The phase shift circuit includes a first capacitor element, a second capacitor element, a first acoustic wave element, and a second acoustic wave element, the first and second acoustic wave elements being connected between the first capacitor element and the second capacitor element and disposed apart from each other on a single acoustic wave path along which acoustic waves propagate through the acoustic wave elements. Each of the first and second acoustic wave elements is a slanted-finger interdigitated transducer electrode. The phase shift circuit has a second phase characteristic that is opposite to the first phase characteristic in an attenuation band that is within the first stopband.

In one example of the electronic device, for each of the first and second acoustic wave elements, the slanted-finger interdigitated transducer electrode includes a pair of comb-shaped electrodes having a plurality of electrode fingers that interdigitate with one another, each electrode finger having a curved shape. In another example of the electronic device, for each of the first and second acoustic wave elements, the slanted-finger interdigitated transducer electrode includes a pair of comb-shaped electrodes that interdigitate with one another, each comb-shaped electrode including a plurality of electrode fingers that extend from a busbar at an angle not equal to 90 degrees.

In one example of the electronic device the phase shift circuit further includes a third acoustic wave element connected between the first capacitor element and the second capacitor element.

In another example of the electronic device the first filter includes a plurality of filter resonators, the first and second acoustic wave elements of the phase shift circuit and the plurality of filter resonators being formed on a single common piezoelectric substrate. In one example the plurality of filter resonators includes a plurality of series arm filter resonators connected in series with one another along a signal line that connects the input terminal and the output terminal, and a plurality of parallel arm filter resonators connected between the signal line and a reference potential, the plurality of series arm filter resonators and the plurality of parallel arm filter resonators together forming a ladder-circuit. The reference potential may be ground, for example.

In one example of the electronic device the first capacitor element is connected between the first acoustic wave element and the input terminal and the second capacitor element is connected between the second acoustic wave element and the output terminal, a capacitance of the first capacitor element being smaller than a capacitance of the second capacitor element.

In another example the electronic device further includes an inductor connected between the output terminal and a ground.

Another embodiment is directed to a duplexer comprising an input terminal, an output terminal, a common terminal, a transmission filter connected between the input terminal and the common terminal, and a reception filter connected between the common terminal and the output terminal. The transmission filter has a first passband, a first stopband, and a first phase characteristic within an attenuation band corresponding to at least a portion of the first stopband. The reception filter has a second passband that overlaps with the first stopband and a second stopband that overlaps with the first passband. The duplexer further comprises a phase shift circuit including a first capacitor element connected to the common terminal, a second capacitor element connected to the input terminal, and a transversal filter connected to the first and second capacitor elements, the transversal filter including at least two slanted-finger interdigitated transducer electrodes disposed apart from each other on a single acoustic wave path along which acoustic waves propagate through the at least two slanted-finger interdigitated transducer electrodes, the phase shift circuit having a second phase characteristic opposite to the first phase characteristic in the attenuation band.

In one example of the duplexer the phase shift circuit is connected in parallel with the transmission filter between the input terminal and the common terminal, the transversal filter being connected in series between the first capacitor element and the second capacitor element. In one example a first capacitance of the first capacitor element is smaller than a second capacitance of the second capacitor element.

In one example of the duplexer the transversal filter includes five slanted-finger interdigitated transducer electrodes. In one example the five slanted-finger interdigitated transducer electrodes include a first slanted-finger interdigitated transducer electrode connected to the first capacitor element, and a second slanted-finger interdigitated transducer electrode connected to the second capacitor element. The phase shift circuit may further include a third capacitor element connected to the common terminal, a fourth capacitor element connected to the input terminal, and a fifth capacitor element connected to the output terminal, and the transversal filter further includes a third slanted-finger interdigitated transducer electrode connected to the third capacitor element, a fourth slanted-finger interdigitated transducer electrode connected to the fourth capacitor element, a fifth slanted-finger interdigitated transducer electrode connected to the fifth capacitor element. In one example the reception filter includes a two-terminal resonator, a first longitudinally-coupled resonator, and a second longitudinally-coupled resonator connected in series between the common terminal and the output terminal. In another example the transmission filter includes a plurality of series arm resonators connected in series with one another along a signal line that connects the input terminal and the output terminal, and a plurality of parallel arm resonators connected between the signal line and a reference potential, the plurality of series arm resonators and the plurality of parallel arm resonators together forming a ladder-circuit. The reference potential may be ground, for example.

In one example of the duplexer the transmission filter includes a plurality of filter resonators, the at least two slanted-finger interdigitated transducer electrodes of the phase shift circuit and the plurality of filter resonators being formed on a single common piezoelectric substrate. The plurality of filter resonators may include a plurality of series arm filter resonators connected in series with one another along a signal line that connects the input terminal and the output terminal, and a plurality of parallel arm filter resonators connected between the signal line and a reference potential, the plurality of series arm filter resonators and the plurality of parallel arm filter resonators together forming a ladder-circuit. The reference potential may be ground, for example.

In another example of the duplexer each of the at least two slanted-finger interdigitated transducer electrodes includes a pair of comb-shaped electrodes having a plurality of electrode fingers that interdigitate with one another, each electrode finger having a curved shape. In another example each of the at least two slanted-finger interdigitated transducer electrodes includes a pair of comb-shaped electrodes that interdigitate with one another, each comb-shaped electrode having a plurality of electrode fingers that extend from a busbar at an angle not equal to 90 degrees.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 11A is a diagram showing another example of an antenna duplexer including a phase shift circuit connected in parallel with the transmission circuit according to aspects of the present invention;

DETAILED DESCRIPTION

As discussed above, filters are widely used in many electronic devices, including wireless communications devices. On an advanced power amplifier and antenna duplexer module at least half of the electronic components are filters. Further, on an advanced front-end radio frequency (RF) module used in wireless communications devices, there can be several (e.g., three to eight) filter-based duplexers. The power isolation specification from the transmit filter to the receive filter, which can range from approximately −55 dB to −70 dB, can be one of the most critical parameters for duplexers. As discussed above, the use of an auxiliary circuit in an antenna duplexer to achieve high isolation between filters in the duplexer is disclosed in U.S. Pat. No. 9,246,533. The auxiliary circuits disclosed in U.S. Pat. No. 9,246,533 use acoustic wave elements that are formed with conventional interdigitated transducers in which the electrode fingers are straight. As discussed in more detail below, aspects and embodiments are directed to the use of slanted-finger interdigitated transducer (SFIT) electrodes in phase shift circuits that can be used in combination with filter circuits, optionally in antenna duplexers, for example, to improve the characteristics of the filter circuits. In particular, in certain embodiments the phase shift circuit is used to improve attenuation in the stopband of the filter, without negatively impacting the transmission band (also referred to as the passband) of the filter, such that the isolation characteristic of an antenna duplexer in which the filter is used can be improved. The use of SFIT electrodes provides additional degrees of freedom in the design, allowing greater ability to optimize the phase shape over a wider frequency band and further improve the isolation characteristic beyond what can be achieved using other circuit designs.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
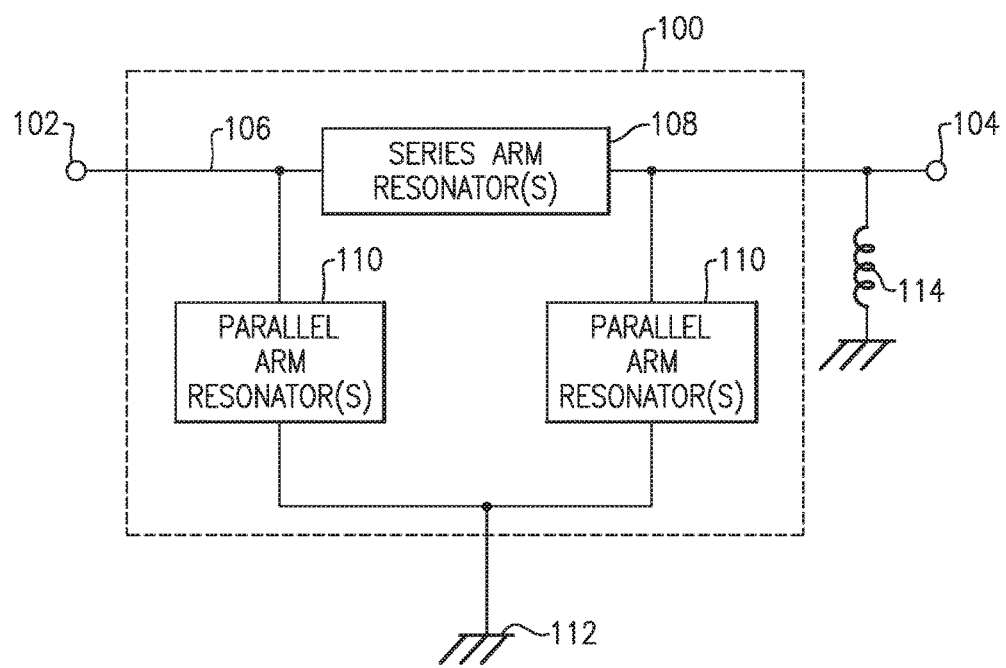
FIG. 1 is a block diagram of one example of a conventional ladder-type filter.
Figure 2:
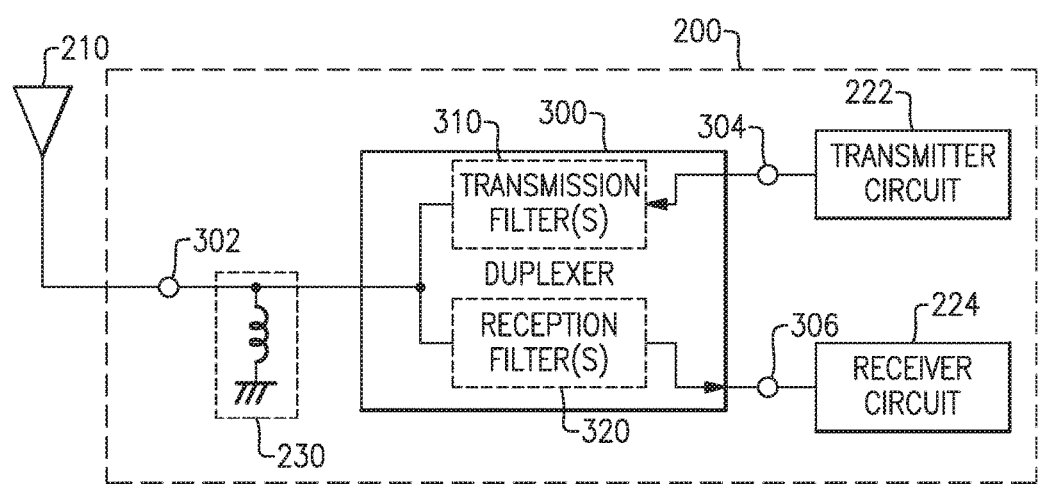
FIG. 2 is a block diagram of one example of a front-end module for an electronic device including an antenna duplexer according to aspects of the present invention.

Referring to FIG. 2 there is illustrated a block diagram of one example of a front-end module 200, which may be used in an electronic device such as a wireless communications device (e.g., a mobile phone) for example. The front-end module 200 includes an antenna duplexer 300 having a common terminal 302, an input terminal 304, and an output terminal 306. An antenna 210 is connected to the common terminal 302. The front-end module 200 further includes a transmitter circuit 222 connected to the input terminal 304 of the duplexer 300 and a receiver circuit 224 connected to the output terminal 306 of the duplexer 300. The transmitter circuit 222 can generate signals for transmission via the antenna 210, and the receiver circuit 224 can receive and process signals received via the antenna 210. In some embodiments such reception and transmission functionalities can be implemented in separate components, as illustrated in FIG. 2, or in a common transceiver circuit/module, as discussed further below. As will be appreciated by those skilled in the art, given the benefit of this disclosure, the front-end module 200 may include other components, not illustrated, such as, but not limited to, switches, electromagnetic couplers, amplifiers, processors, and the like.

The antenna duplexer 300 may include one or more transmission filters 310 connected between the input terminal 304 and the common terminal 302, and one or more reception filters 320 connected between the common terminal 302 and the output terminal 306. An inductor 230 or other matching component can be connected at the common terminal 302. The isolation characteristic of the duplexer 300 refers to the passing characteristic from the input terminal 304 to the output terminal 306. An improved isolation characteristic can be obtained in the passbands of the filters 310 and 320 by reducing a level of signal that passes between the input terminal 304 and the output terminal 306. As discussed above, one manner by which this can be achieved is to improve signal attenuation in the stopband(s) of at least one of the filters 310 or 320. According to certain embodiments, to assist in achieving this improved isolation characteristic, any one or more of the transmission filters 310, reception filters 320, or a combination thereof, can include a phase shift circuit that is configured to improve attenuation in a stopband of the associated filter, as discussed in detail below. In particular, where the phase shift circuit is used in combination with a transmission filter 310 that is a bandpass filter (and therefore may have more than one stopband), the phase shift circuit can be configured to improve attenuation in a stopband of the transmission filter 310 that overlaps in frequency with the passband of one or more of the reception filter(s) 320. Similarly, where the phase shift circuit is used in combination with a reception filter 320 that is a bandpass filter, the phase shift circuit can be configured to improve attenuation in a stopband of the reception filter 310 that overlaps in frequency with the passband of one or more of the transmission filter(s) 310. As will be appreciated by those skilled in the art, given the benefit of this disclosure, while various features and functions are discussed below in the context of duplexers, aspects and advantages of the methods and devices disclosed herein may be applied equally to diplexers or multiplexers and are not limited to use in duplexers.

Figure 3A:
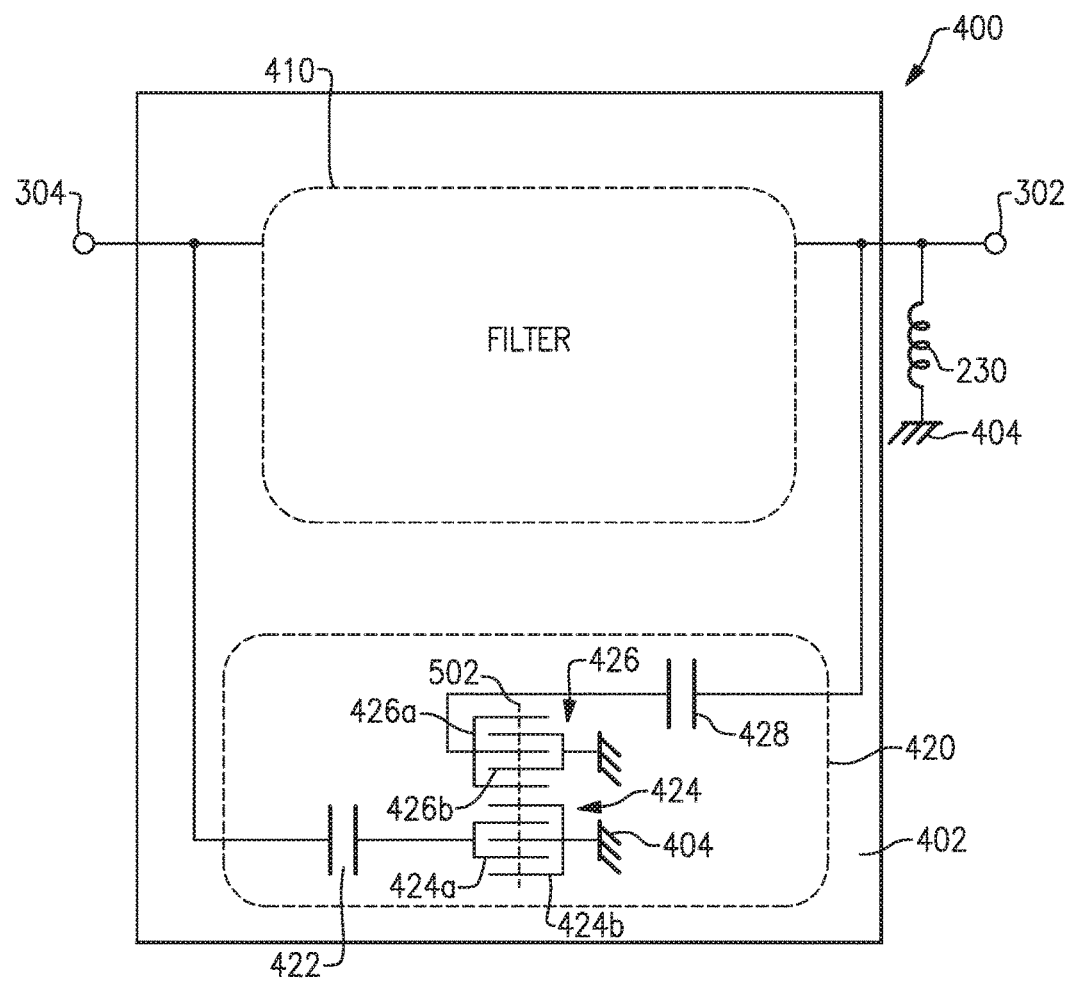
FIG. 3A is a circuit diagram of one example of filter that can be used in the antenna duplexer of FIG. 2 according to aspects of the present invention.

Referring to FIG. 3A there is illustrated a schematic circuit diagram of one example of a filter 400 according to one embodiment. In one example the filter 400 is a high frequency filter, as may be used as the transmission filter 310 in the antenna duplexer 300, for example. The filter 400 includes a main filter circuit 410 connected between an input terminal 304 and an output terminal 302, which may correspond to the input terminal 304 and the common terminal 302 of the duplexer 300, for example. The filter 400 also includes a phase shift circuit 420 connected in parallel with the main filter circuit 410 between the input terminal 304 and the output terminal 302. The filter 400 further includes a piezoelectric substrate 402, on which components of the main filter circuit 410 and the phase shift circuit 420 can be formed, as discussed further below. As discussed above, an inductor 230 can be connected to the output terminal 302. The inductor 230 may be connected between the output terminal 302 and a reference potential 404. In certain examples the reference potential 404 is ground.

The main filter circuit 410 may have a variety of characteristics and configurations, as will be appreciated by those skilled in the art, given the benefit of this disclosure. In certain examples, the main filter circuit 410 can be a ladder-type filter circuit including a plurality of acoustic resonators; however, in other examples the main filter circuit 410 need not be a ladder-type filter and can have another configuration.

Figure 3B:
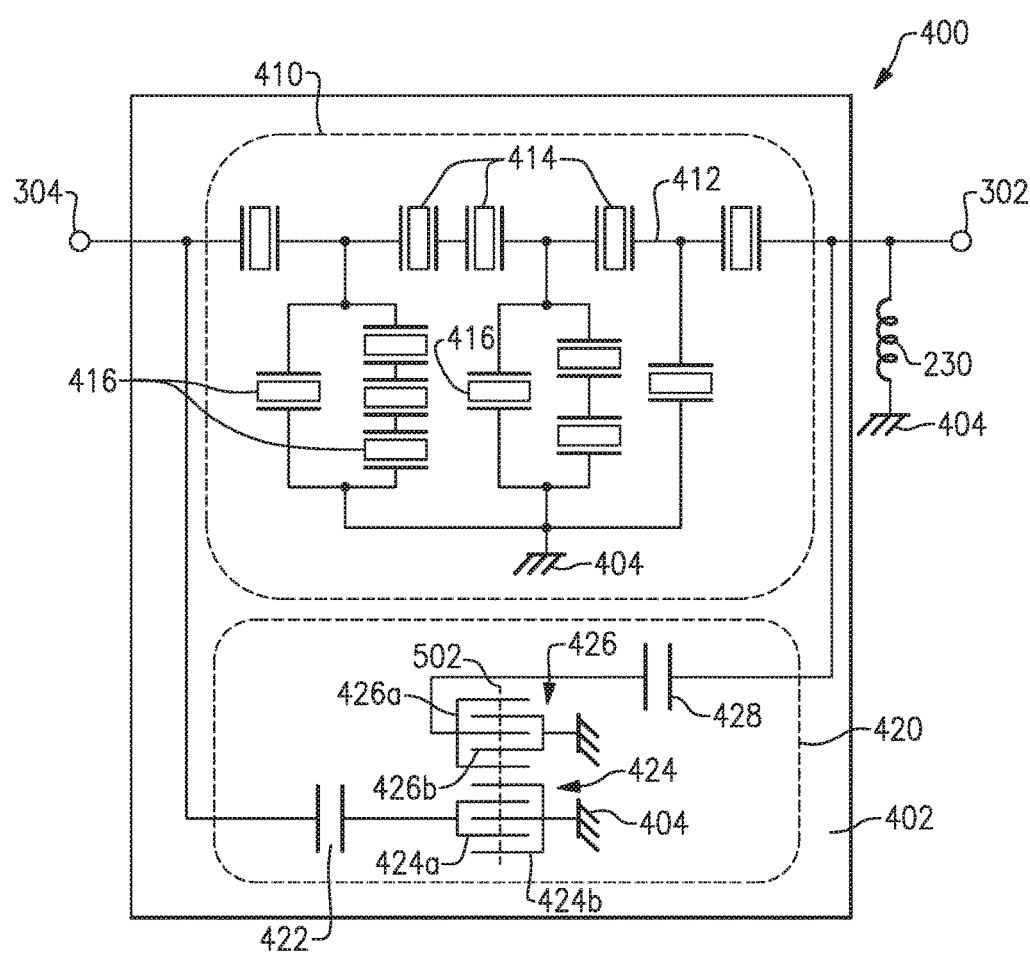
FIG. 3B is a circuit diagram showing one example of the main filter circuit of the filter of FIG. 3A according to aspects of the present invention.

FIG. 3B illustrates one example of the filter 400 in which the main filter circuit 410 has a ladder-type configuration. In this example the main filter circuit 410 includes a signal line 412 connecting the input terminal 304 to the output terminal 302. The main filter circuit 410 includes a plurality of series arm resonators 414 and a plurality of parallel arm resonators 416. The series arm resonators 414 are connected in series with each other along the signal line 412 between the input terminal 304 and the output terminal 302. The parallel arm resonators 416 are connected between the signal line 412 and the reference potential 404. The series arm resonators 414 and parallel arm resonators 416 together form a ladder-type filter. As will be appreciated by those skilled in the art, given the benefit of this disclosure, the arrangements and numbers of series arm resonators 414 and parallel arms resonators 416 shown in FIG. 3B is only one example of a ladder-type filter, and numerous other ladder-type filter configurations can be used, including various combinations of one or more series arm resonators 414 and parallel arm resonators 416. In one example, the series arm resonators 414 and the parallel arm resonators 416 are surface acoustic wave resonators formed on the piezoelectric substrate 402. In other examples the resonators are boundary acoustic wave resonators or bulk acoustic wave resonators formed on the piezoelectric substrate 402. In one example the main filter circuit 410 functions as a band-pass filter having a frequency response (also referred to a passing characteristic) that includes a passband and a stopband. In applications where the filter 400 is used as the transmission filter 310 in the antenna duplexer 300, the stopband of the main filter circuit 410 may overlap in frequency with at least a portion of the passband of the reception filter 320.

As shown in FIGS. 3A and 3B, the phase shift circuit 420 is connected in parallel with the main filter circuit 410 between the input terminal 304 and the output terminal 302. In the illustrated example, the phase shift circuit 420 includes a first capacitor element 422, a first SFIT electrode 424, a second SFIT electrode 426, and a second capacitor element 428 disposed in that order between the input terminal 304 and the output terminal 302. Thus, the first capacitor element 422 is connected between the first SFIT electrode 424 and the input terminal 304, and the second capacitor element 428 is connected between the second SFIT electrode 426 and the output terminal 302, such that the two SFIT electrodes are connected between the two capacitor elements, as shown in FIGS. 3A and 3B. The SFIT electrodes 424 and 426 can be acoustic wave elements formed on the piezoelectric substrate 402 (i.e., elements that produce signals using acoustic waves propagating on the piezoelectric substrate 402). Accordingly, each SFIT electrode 424 and 426 includes a pair of comb-shaped electrodes (424a, 424b, and 426a, 426b) having electrode fingers that interdigitate with one another. A first comb-shaped electrode 424a, 426a of each of pairs of comb-shaped electrodes is connected to the signal line (i.e., to the first capacitor element 422 and the second capacitor element 428, respectively), and the other comb-shaped electrode 424b, 426b of each pair is connected to the reference potential 404.

According to one embodiment the phase shift circuit 420 has frequency response that has an amplitude similar to the amplitude of the frequency response of the main filter circuit 410 over at least a portion of the stopband of the main filter circuit 410, which is referred to herein as an "attenuation band." In addition, the phase shift circuit 420 may have a phase characteristic opposite to a phase characteristic of the main filter circuit 410 in the attenuation band of the main filter circuit 410. Responsive to receiving an input signal at the input terminal 304, the main filter circuit 410 is configured to provide a main signal at the output terminal 302 and the phase shift circuit 420 is configured to provide an auxiliary signal at the output terminal 302. The phase shift circuit 420 is configured such that the auxiliary signal has a similar amplitude and opposite phase to the main signal over a particular frequency band (e.g., the attenuation band of the main filter circuit 410), such that the auxiliary signal at least partially "cancels" the main signal, thereby increasing signal attenuation in the attenuation band, which can improve the isolation characteristic of the duplexer 300 when the filter 400 is used therein. As discussed in more detail below, the shape, frequency range, amplitude, and phase of the frequency response of the phase shift circuit 420, and therefore the characteristics of the auxiliary signal, can be determined through the design of the SFIT electrodes 424 and 426 and the capacitor elements 422 and 428. In particular, the use of SFIT electrodes 424 and 426 provides additional degrees of design freedom, relative to conventional interdigital electrodes, allowing the frequency response of the phase shift circuit to be finely tuned over a wider frequency band to improve the desired signal attenuation properties without negatively impacting the passband of the main filter circuit 410.

The amplitude of the frequency response of the phase shift circuit 420, in particular the amount of signal attenuation in the attenuation band, can be adjusted by adjusting the capacitances of the capacitor elements 422 and 428. The capacitor elements 422 and 428 can be appropriately designed so as to allow the amplitude of the passing characteristic of the phase shift circuit 420 to be similar to the amplitude of the passing characteristic of main filter circuit 410 in the attenuation band, as discussed above. In certain examples, capacitances of the capacitor elements 422 and 428 are smaller than capacitances of the SFIT electrodes 424 and 426. In addition, in certain examples the capacitance of the capacitor element 422 closer to the input terminal 304 is smaller than that of the capacitor element 428 closer to the output terminal 302. This arrangement allows the amplitude of the auxiliary signal output from the phase shift circuit 420 to be substantially equal to the amplitude of main signal output from the main filter circuit 410, thereby increasing the amount of signal attenuation in the attenuation band.

As noted above and as shown in FIGS. 3A and 3B, the SFIT electrodes 424 and 426 are connected between the two capacitor elements 422 and 428. This arrangement can protect the first and second SFIT electrodes 424 and 426 from an electric current flowing into the phase shift circuit 420, and from potential damage that could otherwise be caused by that electric current. In particular, an electric current that flows into the phase shift circuit 420 from the main filter circuit 410 can be suppressed by adjusting the electrostatic capacitances of the capacitor elements 422 and 428, thereby performing the function of protecting the SFIT electrodes 424 and 426 from damage.

Still referring to FIGS. 3A and 3B, the first and second SFIT electrodes 424, 426 of the phase shift circuit 420 are disposed apart from one another by a predetermined distance along a single acoustic path 502 along which the acoustic waves propagate, and together form a transversal filter. The frequency response of the phase shift circuit 420 in the attenuation band is adjusted by designing this transversal filter. For example, the phase characteristic of the phase shift circuit can be finely adjusted by adjusting the distance between the SFIT electrodes 424, 426 along the acoustic path 502, such that the auxiliary signal contains a phase component opposite to a phase component of the main signal in the attenuation band. Opposite phase is defined as a difference in the phases between the main signal output from the main filter circuit 410 and the auxiliary signal output from the phase shift circuit 420 (in response to the signal input at the input terminal 304) being approximately 180 degrees, although not necessarily precisely 180 degrees. Since the phase characteristic of the phase shift circuit 420 is opposite to that of main filter circuit 410, the amplitude of the main signal output from the main filter circuit 410 in the attenuation band is at least partially canceled, consequently increasing the amount of signal attenuation in the attenuation band, as discussed above. In certain examples the absolute value of the phase difference between the main signal and the auxiliary signal is ideally 180 degrees; however, an absolute value of the phase difference not smaller than 90 degrees still improves the attenuation by at least partially canceling the main signal because the auxiliary signal has a phase component opposite to a phase component in the main signal. The phase of the auxiliary signal output from the phase shift circuit 420 can be further adjusted by adjusting the capacitances of the capacitor elements 422 and 428, along with adjusting the shape or other design parameters of the SFIT electrodes 424 and 426, as discussed further below.

According to certain embodiments, both the main filter circuit 410 and the phase shift circuit 420 are implemented using acoustic wave elements. This configuration allows changes in the passing characteristic of main filter circuit 410 resulting from changes in the ambient temperature to be similar to changes in the passing characteristic of the phase shift circuit 420 resulting from those same changes in the ambient temperature, thereby reducing degradation in the attenuation attributable to the changes in ambient temperature.

As discussed above, in certain embodiments the acoustic wave elements of both the main filter circuit 410 and the phase shift circuit 420 are disposed on a single piezoelectric substrate 402. This structure reduces the effect of changes in temperature upon the frequency responses of the main filter circuit 410 and the phase shift circuit 420, in particular, reducing degradation in the attenuation characteristics due to changes in the temperature, because both the passing characteristic of the main filter circuit 410 and the passing characteristic of the phase shift circuit 420 change similarly in response to changes in the ambient temperature. In addition, this arrangement may also provide the filter 400 with a small size and an excellent frequency response by forming all the acoustic wave elements on the single piezoelectric substrate 402.

In certain examples at least one electrode finger of the comb-shaped electrode 424b of the first SFIT electrode 424 that is closest to the second SFIT electrode 426 is connected to the reference potential 404, as shown in FIGS. 3A and 3B. This structure may reduce the amount of attenuation of the phase shift circuit 420 in the passband of the main filter circuit 410, thereby reducing an insertion loss of the filter 400 in the passband of the main filter circuit 410.

Figure 3C:
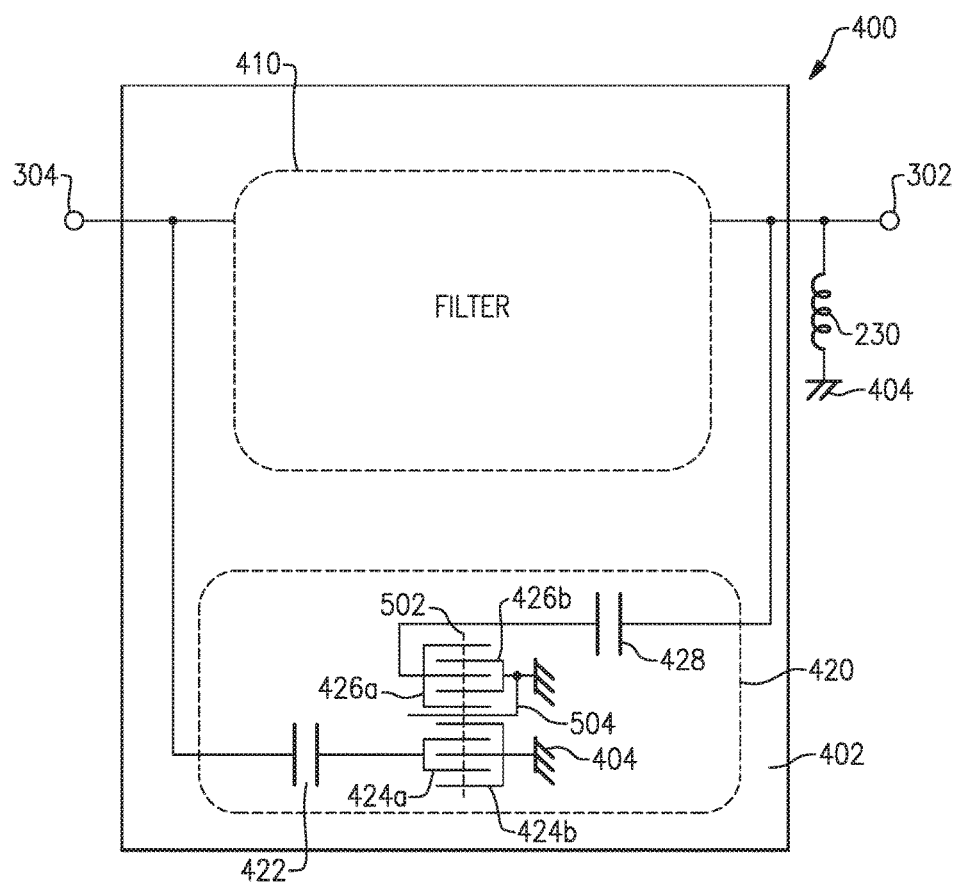
FIG. 3C is a circuit diagram of showing a variation of the filters shown in FIGS. 3A and 3B, according to aspects of the present invention.

FIG. 3C is a circuit diagram of another example of the filter 400. In the example of the filter 400 shown in FIGS. 3A and 3B, no electrode is disposed between the SFIT electrodes 424, 426 of the phase shift circuit 420. In the example of the filter 400 shown in FIG. 3C, the phase shift circuit 420 further includes a shield electrode 504 which is disposed between the two SFIT electrodes 424 and 426, and which is connected to the reference potential 404. The shield electrode 504 may reduce the amount of attenuation of the phase shift circuit 420 in the passband of the main filter circuit 410, thereby reducing the insertion loss of the filter 400 in the passband of the main filter circuit 410.

In certain examples of the filter 400 shown in FIGS. 3A-C, the SFIT electrodes 424, 426 include the same number of electrode fingers. However, in other examples, the number of the electrode fingers of the first SFIT electrode 424 may be different from the number of the electrode fingers of the second SFIT electrode 426. In certain examples, changing the number of electrode fingers between the two SFIT electrodes 424, 426 can reduce the amount of attenuation of the phase shift circuit 420 in the passband of the main filter circuit 410, thereby reducing the insertion loss of the filter 400 in the passband of the main filter circuit 410.

FIGS. 3B and 3C illustrate particular examples of the main filter circuit 410 and the phase shift circuit 420; however, the features and advantages of the phase shift circuit designs disclosed herein, including the use of SFIT electrodes therein as discussed further below, may be applied to phase shift circuits 420 having any configuration, including the examples shown in FIGS. 3A-C, but not limited thereto.

Figure 4A:
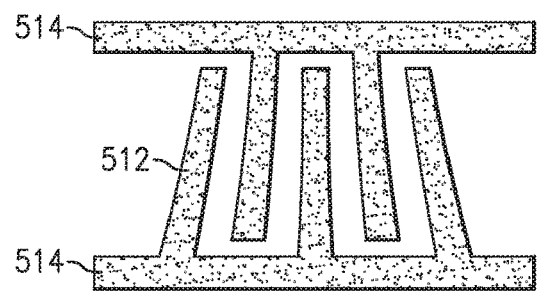
FIG. 4A is a diagram of one example of a slanted-finger interdigitated transducer (SFIT) electrode having curved electrode fingers.
Figure 4B:
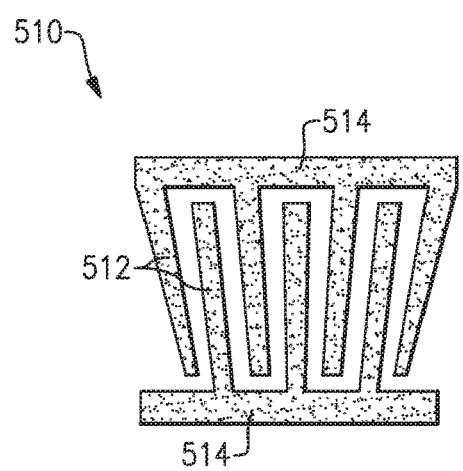
FIG. 4B is a diagram of another example of an SFIT electrode having slanted electrode fingers.
Figure 4C:
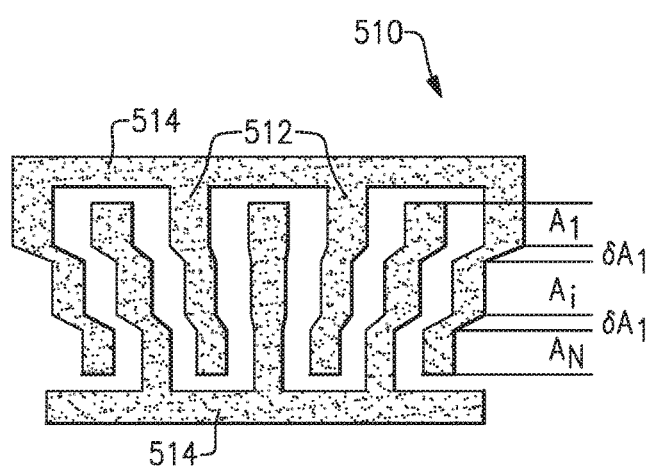
FIG. 4C is a diagram of another example of an SFIT electrode having electrode fingers with a stepped profile.

Conventional interdigitated transducer (IDT) electrodes have straight electrode fingers that are arranged to extend parallel to one another. As discussed above, aspects and embodiments are directed to the use of one or more SFIT electrodes in phase shift circuit 420 instead of conventional IDT electrodes. Referring to FIGS. 4A-C, similar to conventional IDT electrodes, SFIT electrodes 510 include two comb-shaped electrodes each having electrode fingers 512 that extend from a busbar 514 and interdigitate with one another, but unlike conventional IDT electrodes, the electrode fingers are not straight. For example, the electrode fingers 512 of SFIT electrodes may be curved (as shown in FIG. 4A, for example), slanted (as shown in FIG. 4B, for example), or have a "stepped" profile (as shown in FIG. 4C, for example), rather than being straight (i.e., extending perpendicular from the busbar 514). As a result, additional degrees of freedom (e.g., degree of slant/curvature, number and size of "steps" in the stepped profile, etc.) in the design of SFIT electrodes are obtained, which can be beneficial in certain applications, such as when used in the phase shift circuit 420. For example, the additional degrees of freedom in the design may allow precise tailoring of the shape of the phase characteristic of the phase shift circuit 420 over a wider frequency band than may be achieved using conventional IDT electrodes.

SFIT electrodes add complexity in design (including in the simulations necessary to derive new circuit designs) and manufacturing, which can add time and cost to the production of electronic devices in which they are used. Accordingly, conventional wisdom may suggest that in many instances it may be preferable to avoid the use of SFIT electrodes. However, as disclosed herein, for the particular application and function of the phase shift circuit 420, the additional degrees of freedom provided by the use of SFIT electrodes can be beneficial. The phase shift circuit 420 may be very small, including for example only two SFIT electrodes 424, 426, so as not to significantly increase the size or component count of the electronic device in which it is used. In addition, the SFIT electrodes 424 or 426 may also be small, including for example only a few electrode fingers in each of the comb-shaped electrodes. Further, the phase shift circuit 420 is designed to achieve a very specific purpose, namely, providing a passing characteristic that has a very similar amplitude and opposite phase to that of the main filter circuit 410 within a particular specified frequency band. Accordingly, in such applications where high performance is desired and the available components with which to achieve the specified performance parameters are limited, the additional design degrees of freedom provided by the use of SFIT electrodes can be highly beneficial and justify the associated additional complexity. In contrast, for example, the main filter circuit 410 may include many resonators 108 or 110, each of which may be large (having numerous electrode fingers), and thus may already have sufficient design flexibility (achieved through the relatively large number and size of the resonators) such that the added complexity of SFIT electrodes may not be warranted in this type of circuit and conventional IDT electrodes can be used.

The use of SFIT electrodes, rather than conventional IDT electrodes, in the phase shift circuit 420 allows a substantially constant phase characteristic to be achieved over a wider frequency band, and also provides additional degrees of freedom to optimize the phase shape over a wider frequency band. In conventional IDT electrodes, only the spacing between electrode fingers (referred to as the electrode-finger pitch) and the number of electrode fingers can be adjusted to alter the amplitude or phase of the frequency response of the electrode, whereas with SFIT electrodes various other structural features can be adjusted to tune the frequency response. For example, referring to FIG. 4A, in the case of an SFIT electrode 510 with curved electrode fingers, the shape, direction, and degree of curvature can be adjusted. For example, the curvature may be parabolic, and the electrode fingers of adjacent SFIT electrodes may curve in the same or different directions (i.e., towards or away from one another). Further, the shape, direction, or degree of curvature may vary between different electrode fingers.

Figure 5:
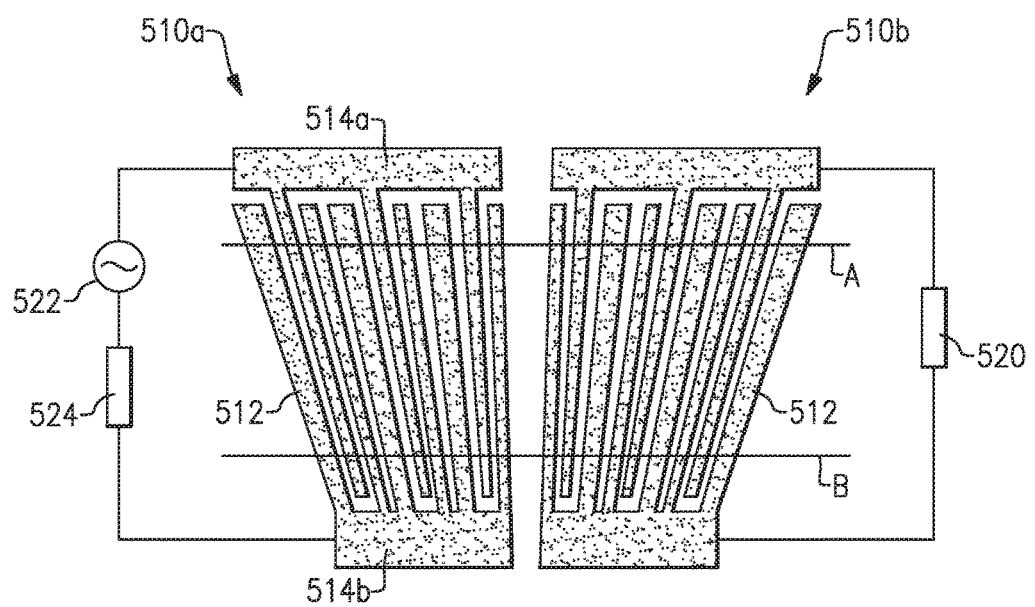
FIG. 5 is a diagram showing a simulation approach for a phase shift circuit including a pair of SFIT electrodes according to aspects of the present invention.

Referring to FIG. 4B, in the case of an SFIT electrode 510 with slanted electrode fingers 512, the angle of the slant with respect to the busbars 514 may be varied, and the electrode fingers of adjacent SFIT electrodes may slant towards or away from one another. For example, FIG. 5 illustrates a pair of SFIT electrodes 510a, 510b, with slanted electrode fingers 512 that slant towards one another. The angle or direction of the slant may vary between different electrode fingers.

Referring to FIG. 5, the operation of SFIT electrodes can be modeled and explained as follows. A signal source 522 produces a current that can be converted to a voltage across impedance element 524 and applied to the busbars 514a and 514b of the SFIT electrode 510a, which generates an acoustic wave that propagates through the SFIT electrodes 510a and 510b, and produces a signal that can be read out across impedance element 520. Each SFIT electrode finger 512 sets up acoustic surface waves in synchronism with the applied voltage excitation from the signal source 522. The frequency response of the interdigitated transducer is dependent on the electrode-finger pitch. In a conventional IDT with straight electrode fingers, the electrode-finger pitch is constant over the length of the electrode fingers, and the IDT accordingly operates efficiently over only a narrow frequency band. In contrast to conventional IDT electrodes, in the SFIT electrode, the electrode-finger pitch can vary along the length of the electrode fingers (along the distance between the upper and lower busbars 514a, 514b in the region between lines A and B) to account for the slant or curvature. Accordingly, in SFIT electrodes, the synchronous frequency is a function of position along the acoustic aperture (defined by the distance between the two busbars 514a, 514b of each SFIT electrode). The SFIT electrodes act to spatially separate frequency components of the input signal across the acoustic aperture, and therefore the frequency response of the SFIT electrode is wider-band. By controlling the varying electrode finger pitch over the acoustic aperture (along the length of the electrode fingers), the phase shift at different frequencies can be altered, and the phase characteristic can be tailored over a relatively wide frequency band. In addition, the acoustic power transmitted from the SFIT electrodes 510a, 510b depends on the distribution of synchronous frequencies along the acoustic aperture coordinate, which is a function of the slant or curvature of the fingers. Thus, for the curved finger example of FIG. 4A, by varying the curvature of the electrode fingers 512, the shape of the amplitude of the frequency response of the SFIT electrodes 424 and 426 can be altered to produce a tailored amplitude characteristic in the passband or stopband of the phase shift circuit 420. Similarly, for slanted-finger examples, such as those shown in FIGS. 4B and 5, varying the angle of the slant can tailor the phase and amplitude characteristics of the frequency responses of the SFIT electrodes 424 and 426.

According to certain embodiments, the SFIT electrodes 510 can be implemented using a stepped profile for the electrode fingers 512, such as shown in FIG. 4C, for example. The stepped profile can be used to approximate slanted (as shown in FIG. 4C) or curved electrode fingers 512. For the slanted and curved electrode finger examples of FIGS. 4A and 4B, the SFIT electrode has an effective or "macroscopic" electrode-finger pitch that is the average of the electrode-finger pitch along the length of the electrode fingers. According to certain embodiments, the electrode finger pitch can also be varied along the length of the electrode fingers 512, allowing the phase to be tuned for multiple different frequencies. For example, referring to FIG. 4C, each electrode finger 512 can be "divided" into a plurality of straight regions A1 to An, separated from one another by slanted regions δA1, δAi, etc., where n is an integer greater than one and i extends over the range from 1 to n. In the illustrated example, the SFIT electrode 510 has three regions Ai; however, any number of regions can be used. The thickness of the electrode fingers 512 in each region Ai can be the same or different. The slanted regions δAi can be the same or different, resulting in the same or different electrode-finger pitch between regions Ai. In the example shown in FIG. 4C, the slanted regions δAi are used to create the approximate slant or curvature of the electrode fingers 512; however, in other examples the electrode fingers may simply be divided into vertically contiguous or nearly contiguous straight segments that are laterally offset from one another to create an approximate slanted or curved shape, rather than fabricating slanted regions of the electrode fingers.

Figure 6:
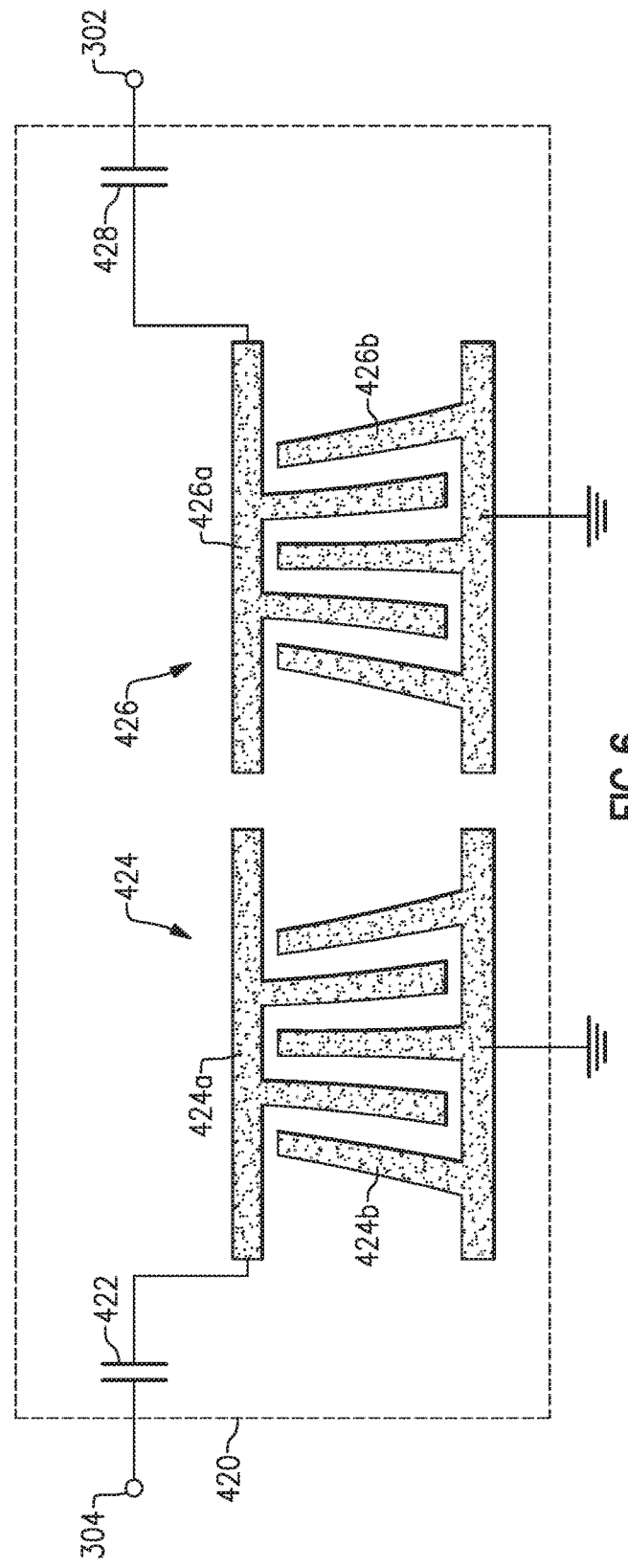
FIG. 6 is a diagram of one example of a phase shift circuit including a pair of SFIT electrodes according to aspects of the present invention.

Multiple acoustic wave elements implemented using SFIT electrodes can be positioned adjacent one another on a piezoelectric substrate. In addition to the ability to vary the electrode-finger pitch within a given SFIT electrode 510, the spacing or pitch between adjacent SFIT electrodes, such as between the SFIT electrodes 424 and 426, can also be varied, allowing further tuning of the phase or amplitude characteristics of the frequency response of the phase shift circuit 420. FIG. 6 illustrates one example of the phase shift circuit 420 in which the SFIT electrodes 424 and 426 have curved electrode fingers, such as in the example shown in FIG. 4A. In other examples the SFIT electrodes 424 and 426 can have slanted electrode fingers or stepped electrode fingers, as discussed above.

Thus, aspects and embodiments provide a phase shift circuit 420 that can be configured to provide an auxiliary signal that can effectively cancel the main signal output from the main filter circuit 410 over a particular frequency band of interest, thereby greatly improving the isolation characteristic of the antenna duplexer 300 or similar electronic device including one or more filters 400. By using SFIT electrodes instead of conventional IDT electrodes in the phase shift circuit 420, superior performance can be achieved while advantageously maintaining a small size and low component count for the phase shift circuit 420. As discussed above, using SFIT electrodes provides additional degrees of freedom in the circuit design of the phase shift circuit 420. In particular, the phase characteristics can be tailored over a wider frequency band by using multiple "channels" in the SFIT electrode design to optimize electrode-finger pitches and SFIT electrode spacing for different frequencies. As a result, the frequency response of the phase shift circuit 420 can be expanded, enabling desired attenuation or canceling of the signal from the main filter circuit 410 over a wider frequency band.

Figure 7:
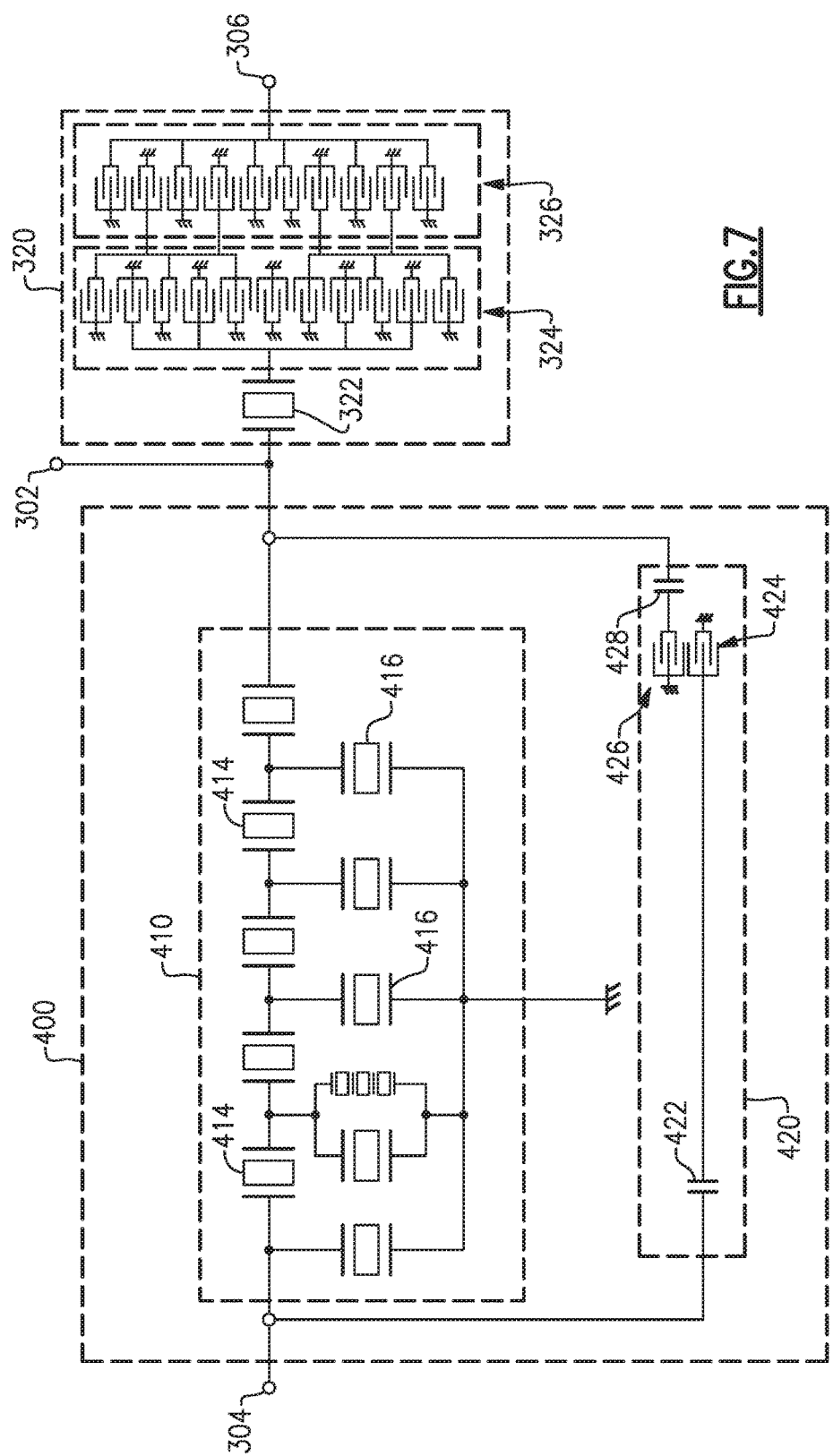
FIG. 7 is a diagram of another example of an antenna duplexer including a phase shift circuit connected in parallel with the transmission circuit according to aspects of the present invention.

FIG. 7 is a diagram showing a particular example of an antenna duplexer 300 that was used to simulate and measure various performance characteristics, as discussed below with reference to FIGS. 8A-C and 9A-C. An embodiment of the filter 400 is used as a transmission filter in the antenna duplexer 300. In this example, the main filter circuit 410 includes a plurality of series arm resonators 414 and parallel arm resonators 416 arranged as shown. The phase shift circuit 420, including the first capacitor element 422, the first SFIT electrode 424, the second SFIT electrode 426, and the second capacitor element 428, is connected in parallel with the transmission filter 410 between the input terminal 304 and the common terminal 302. In this example, the reception filter 320 includes a two-terminal resonator 322, a first longitudinally coupled resonator 324, and a second longitudinally coupled resonator 326 that are connected in series between the common terminal 302 and the output terminal 306, as shown in FIG. 7.

Figure 8A:
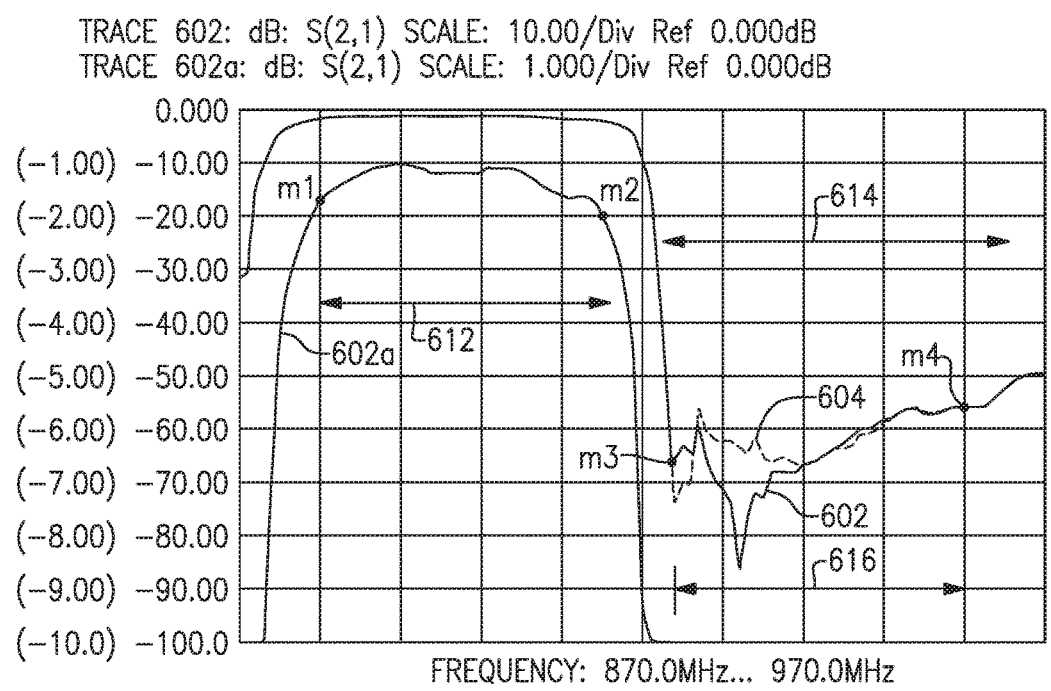
FIGS. 8A-C are simulated characteristic charts of an example of the antenna duplexer of FIG. 7 according to aspects of the present invention.
Figure 8B:
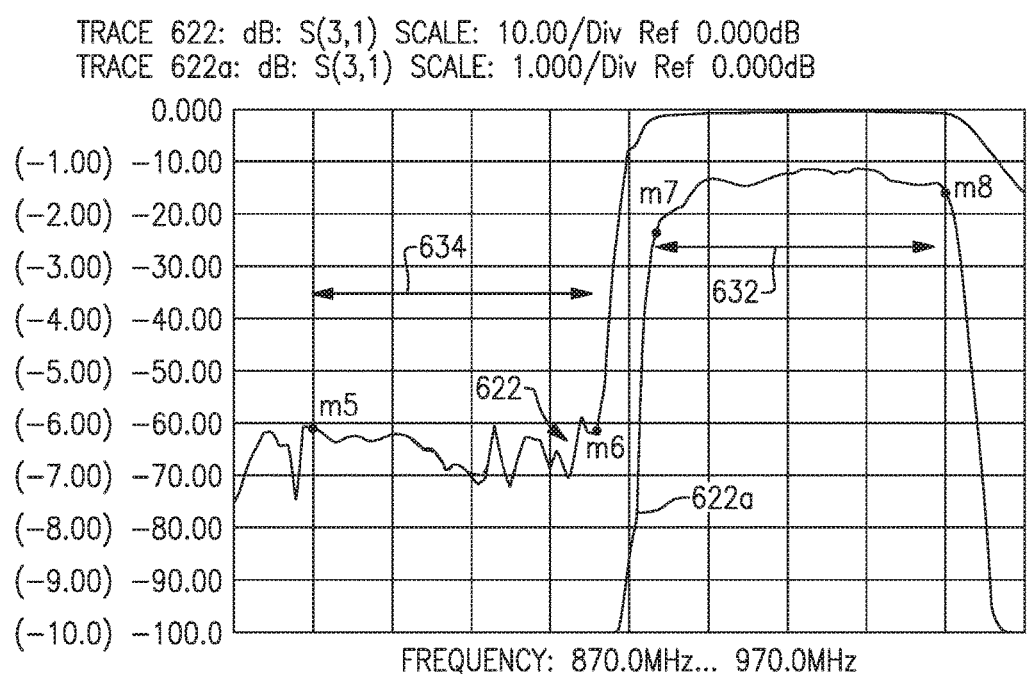
Figure 8C:
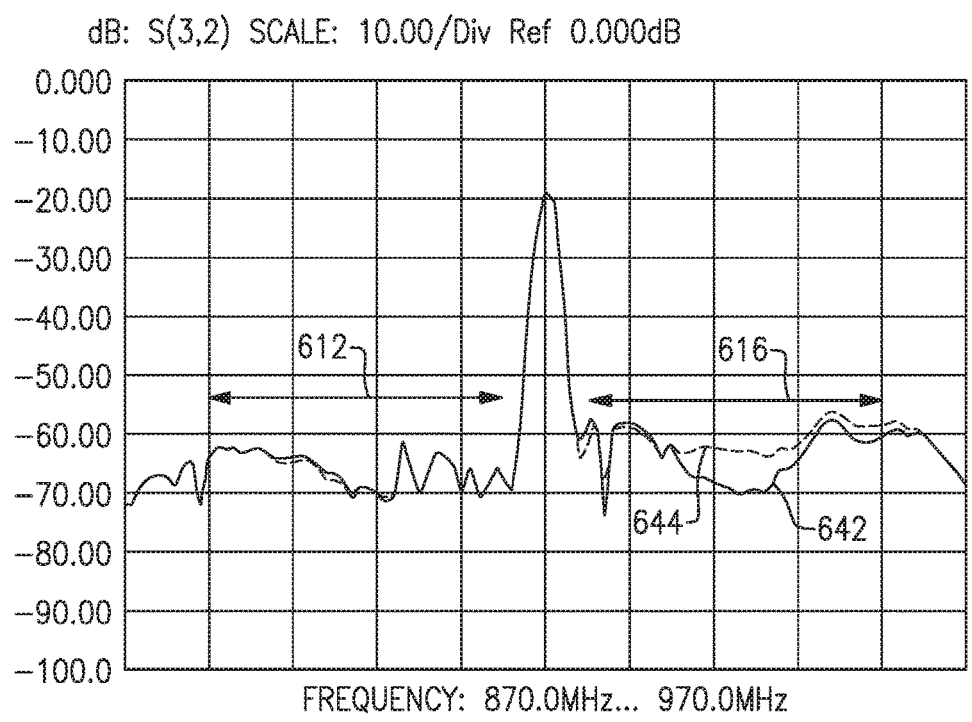

FIGS. 8A-C are graphs showing various simulated characteristics of an example of the antenna duplexer 300 of FIG. 7, demonstrating operation of the phase shift circuit 420 to improve the isolation characteristic of the duplexer. For the simulations, the SFIT electrode 424 included 23 electrode fingers, and the SFIT electrode 426 included nineteen electrode fingers. FIGS. 8A-C and 9A-C also show simulated characteristics for a comparative example of an antenna duplexer having the same configuration as shown in FIG. 7, but wherein the phase shift circuit included two conventional IDT electrodes, rather than the SFIT electrodes. FIGS. 8A-C show the simulated results for the three-port S-parameters of the antenna duplexer 300 of FIG. 7B, with port 1 being the common terminal 302 (to which an antenna would be coupled), port 2 being the input terminal 304, and port 3 being the output terminal 306.

FIG. 8A shows the amplitude of the simulated passing characteristic of the main filter circuit 410 from the input terminal 304 to the common terminal 302, S(2,1). In FIG. 8A the vertical axis represents the amplitude of the passing characteristic, corresponding to amount of attenuation, (in dB), and the horizontal axis represents frequency (in MHz). Trace 602 represents the example of phase shift circuit 420 including the two SFIT electrodes 424, 426 as discussed above and shown in FIG. 7, hereinafter referred to as the "example phase shift circuit," and trace 604 represents a comparative example phase shift circuit including two conventional IDT electrodes, hereinafter referred to as the "comparative example." The main filter circuit 410, acting as a transmission filter in the antenna duplexer 300 of FIG. 7, has a transmission band, or transmit passband 612 and a transmit stopband 614. The transmit passband 612 extends from at least marker m1 to marker m2 (approximately 880 MHz to 915 MHz). An attenuation band 616, in which the phase loop circuit 420 contributes to increased signal attenuation, extends from marker m3 to marker m4 (approximately 925 MHz to 960 MHz), and overlaps with the transmit stopband 614 of the main filter circuit 410. The attenuation of the simulated phase shift circuit and the simulated comparative example are very similar within the transmit passband 616 (indeed, they are so similar that, in FIG. 8A, they are superimposed on one another and not visually distinguishable), but, as shown in FIG. 8A, the simulated example phase shift circuit demonstrates significantly improved attenuation in at least a portion of the attenuation band 616. In FIG. 8A, trace 602a represents an "enlarged" view of trace 602, in which the scale on the vertical axis is in 1 dB increments (indicated in parentheses on FIG. 8A) instead of 10 dB increments as for trace 602. As shown in FIG. 8A, the presence of the phase shift circuit 420 does not negatively impact the frequency response of the main filter circuit 410 in the transmit passband 612.

According to certain examples, the macroscopic electrode-finger pitch of the first and second SFIT electrodes 424, 426 of the phase shift circuit 420 can be controlled to position the attenuation band 616 as desired. For example, in the case where the lowest frequency of the attenuation band 616 is higher than the highest frequency of the transmit passband 612 of the main filter circuit 410 (as shown in FIG. 8A), the macroscopic electrode-finger pitch between adjoining electrode fingers of the SFIT electrodes of the phase shift circuit 420 shown in FIG. 7 is smaller than pitches of the electrode fingers in the resonators of the main filter circuit 410. In the alternate case where the highest frequency of the attenuation band 616 is lower than the lowest frequency of the transmit passband 612 of the main filter circuit 410, the macroscopic electrode-finger pitch between adjoining electrode fingers of the SFIT electrodes is larger than pitches of the electrode fingers in the resonators in the main filter circuit 410. Thus, the macroscopic electrode-finger pitches can be controlled to position the attenuation band 616. In addition, other features of the SFIT electrodes, such as the curvature or slant of the electrode fingers, can be tailored to fine tune the bandwidth of the attenuation band 616 as well as the phase characteristic.

FIG. 8B shows the amplitude of the simulated passing characteristic (trace 622) of the reception filter 320 from output terminal 306 to the common terminal 302, S(3,1) where the example phase shift circuit 420 is connected in parallel with the main filter circuit 410, as shown in FIG. 7. In this simulation, the difference between the results for the example phase shift circuit and the comparative example were too small to be shown on FIG. 8B at the drawn scale. In FIG. 8B, the vertical axis represents the amplitude of the passing characteristic, corresponding to amount of attenuation, (in dB), and the horizontal axis represents frequency (in MHz). The reception filter circuit 320 has a reception band, or receive passband 632, and a receive stopband 634. The receive stopband 634 extends from at least marker m5 to marker m6 (approximately 880 MHz to 915 MHz), and overlaps with the transmit passband 612 of the main filter circuit 410, and the receive passband band 632 extends from at least marker m7 to marker m8 (approximately 925 MHz to 960 MHz), and overlaps with the transmit stopband 614 of the main filter circuit 410 and with the attenuation band 616. Trace 622a represents an "enlarged" view of trace 622, in which the scale on the vertical axis is in 1 dB increments (shown in parentheses) instead of 10 dB increments as for trace 622. As shown in FIG. 8B, the presence of the phase shift circuit 420 does not negatively impact the frequency response of the reception filter circuit 320 in the receive passband 632.

FIG. 8C shows the simulated isolation characteristic measured between the input terminal 304 and the output terminal 306, S(3,2) for the example of the antenna duplexer 300 of FIG. 7 including the example phase shift circuit (trace 642) and the comparative example (trace 644). In FIG. 8C, the vertical axis represents the amplitude of the isolation characteristic (in dB), and the horizontal axis represents frequency (in MHz). As shown, the duplexer including the example phase shift circuit demonstrates significantly greater attenuation, and therefore significantly improved isolation over the attenuation band 616. Thus, these simulation results demonstrate that the use of SFIT electrodes helps to optimize the phase or amplitude characteristics of the phase shift circuit 420 and to improve isolation in the antenna duplexer 300.

Figure 9A:
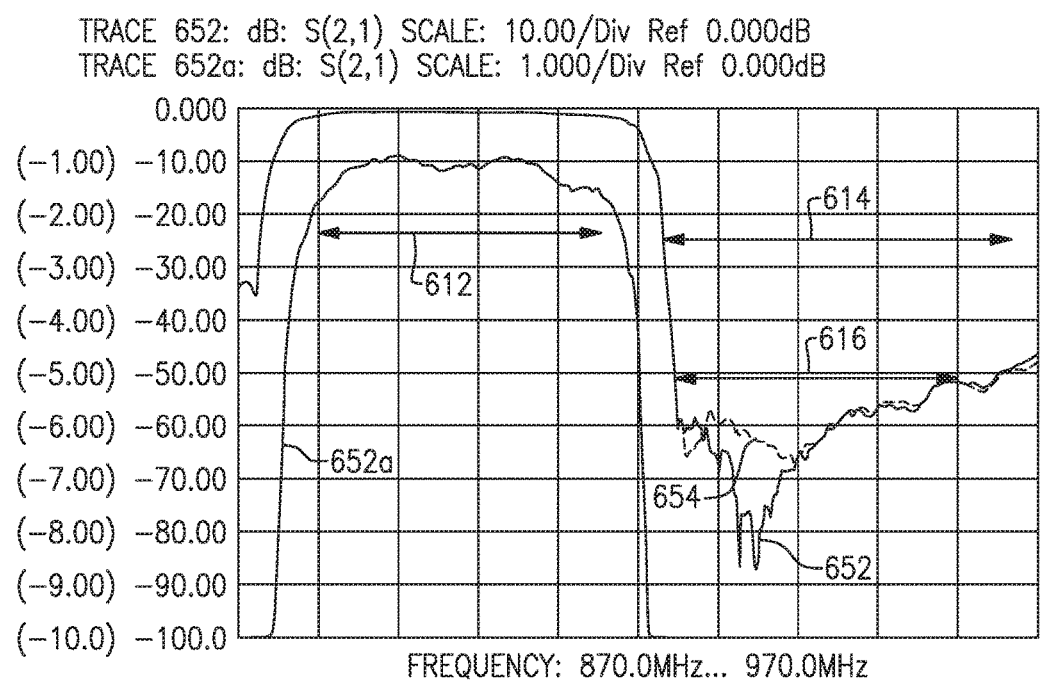
FIGS. 9A-C are characteristic charts presenting measured data corresponding to the simulation results shown in FIGS. 8A-C.
Figure 9B:
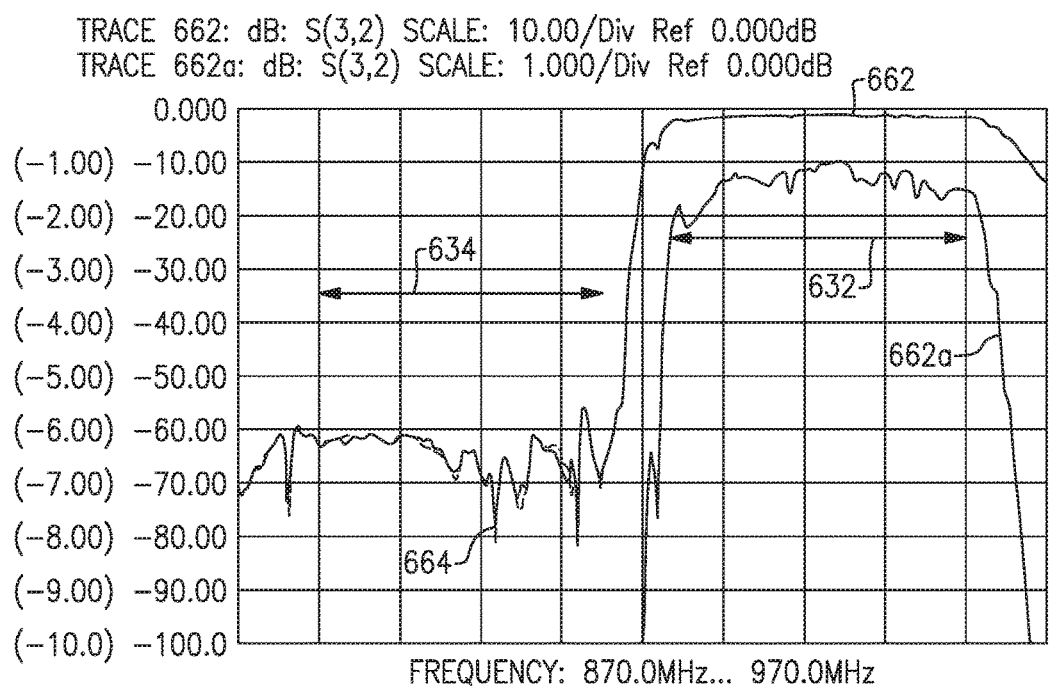
Figure 9C:
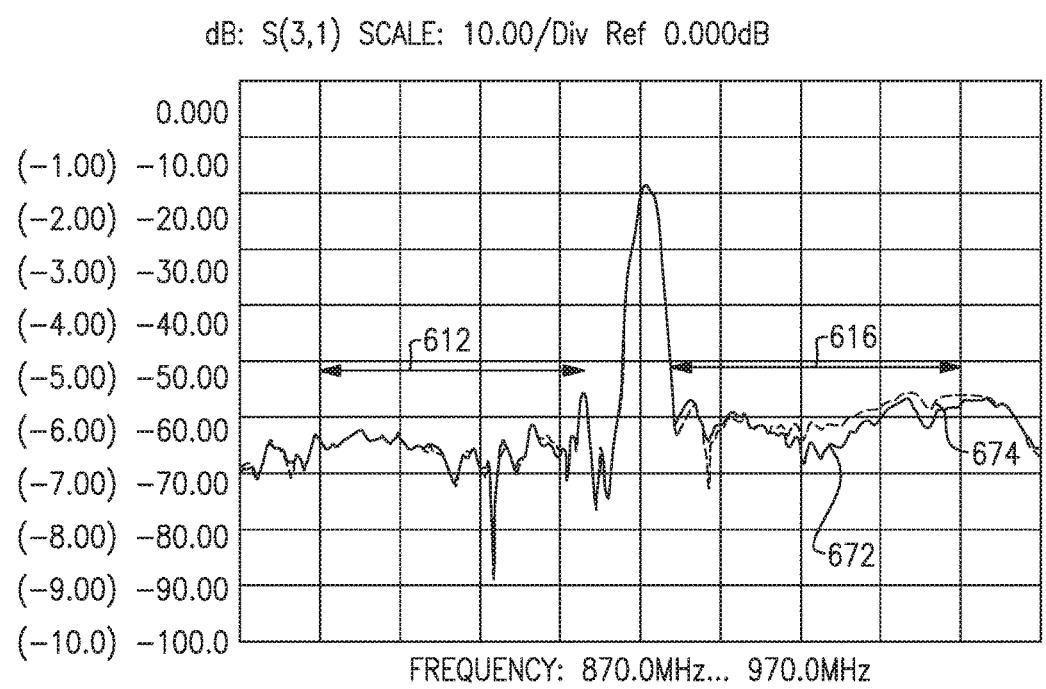

FIGS. 9A-C show measured data corresponding to the simulated results presented in FIGS. 8A-8C. FIG. 9A shows a measured example of the frequency response of the main filter circuit 410 between the input terminal 304 and the common terminal 302, S(2,1), for both the example phase shift circuit (trace 652) and the comparative example (trace 654). Trace 652a represents an "enlarged" view of trace 652, in which the scale on the vertical axis is in 1 dB increments (shown in parentheses) instead of 10 dB increments as for trace 652. FIG. 9B shows a measured example of the frequency response of the reception filter 320 between the output terminal 306 and the common terminal 302, S(3,2), for the example phase shift circuit (trace 662) and the comparative example (trace 664). Trace 662a represents an "enlarged" view of trace 662, in which the scale on the vertical axis is in 1 dB increments (shown in parentheses) instead of 10 dB increments as for trace 662. FIG. 9C shows a measured example of the isolation characteristic between the input terminal 304 and the output terminal 306, S(3,1), for the example phase shift circuit (trace 672) and the comparative example (trace 674). As shown, the antenna duplexer 300 including the example phase shift circuit demonstrates greater attenuation, and therefore improved isolation, over at least the attenuation band 616. The measured data shows good agreement with the corresponding simulated results presented in FIGS. 8A-C.

Thus, a phase shift circuit 420 implemented using SFIT electrodes can provide flexibility to tune the auxiliary signal output from the phase shift circuit to have phase and amplitude characteristics within a selected frequency band that advantageously effectively cancel a corresponding signal output from the main filter circuit 410 when the phase shift circuit 420 is connected in parallel with the main filter circuit 410, as discussed above. As a result, a duplexer 300 (or diplexer or multiplexer) incorporating embodiments of a filter including such a phase shift circuit 420 can have a significantly improved isolation characteristic, which may be important for meeting modern multi-band communications specifications and requirements. Although the above-discussed embodiments have the phase shift circuit 420 connected in parallel with the main filter circuit 410 that may be used as a transmit filter 310, in other embodiments similar benefits and improved filter performance characteristics can be achieved by connecting the phase shift circuit 420 in parallel with a main filter circuit that is used as a reception filter 320 in a duplexer or another electronic device.

In certain examples discussed above the phase shift circuit 420 includes a pair of SFIT electrodes 424, 426; however, the phase shift circuit 420 may include more than two SFIT electrodes disposed on the piezoelectric substrate 402 along the acoustic path 502. Any or all of the SFIT electrodes can be implemented using curved, slanted, or stepped electrode fingers as discussed above. Using more SFIT electrodes may increase the circuit complexity, but may provide additional degrees of freedom.

Figure 10A:
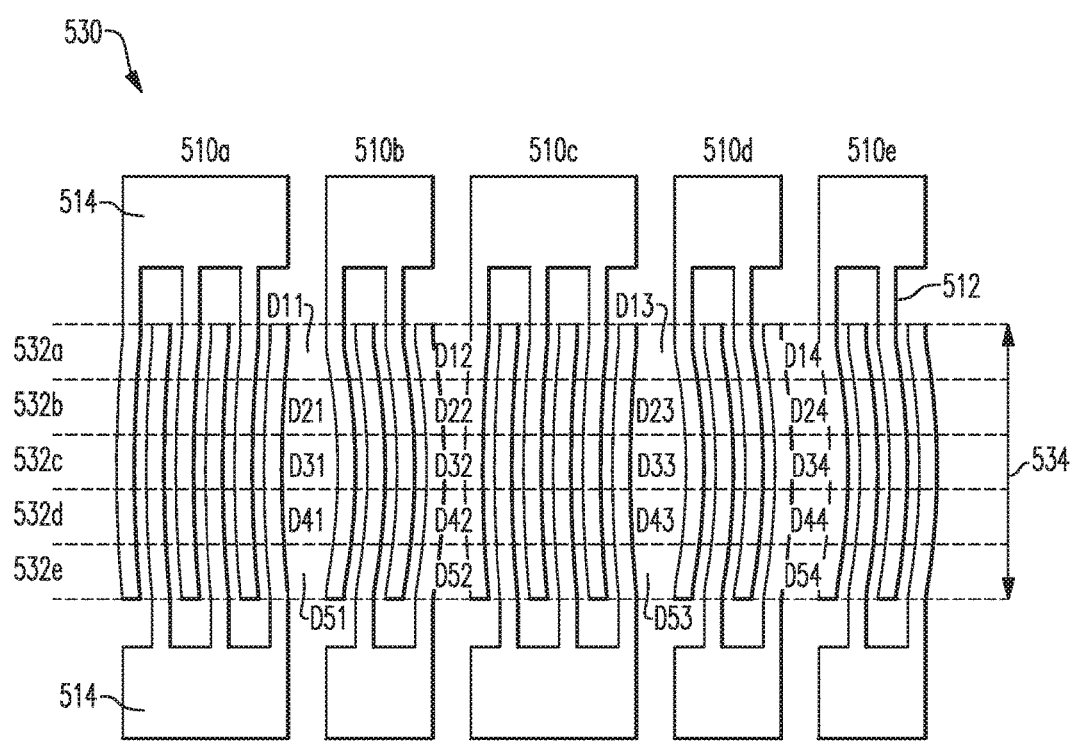
FIG. 10A is a diagram of one example of an SFIT electrode assembly including five SFIT electrodes according to aspects of the present invention.

Referring to FIG. 10A there is illustrated a schematic diagram of one example of an SFIT electrode assembly 530 (which may be used for certain examples of the phase shift circuit 420) that includes five SFIT electrodes 510a, 510b, 510c, 510d, and 510e, each having stepped profile electrode fingers that approximate a curved shape. The SFIT electrode assembly 530 is "divided" into five horizontal channels 532a-e in the vertical dimension 534 (corresponding to the acoustic aperture dimension). Each channel has an individually customizable spacing Dij between adjacent electrode fingers in adjacent SFIT electrodes, with i representing the channel number (i.e., from 1 to 5) and j representing the sequential gap between adjacent SFIT electrodes (i.e., from 1 to 4). Thus, spacing D23 is the spacing between SFIT electrodes 510c and 510d (the third "gap" counting from the left in the figure) in the second channel 532b. In the example illustrated in FIG. 10A, the first and second SFIT electrodes 510a and 510b curve "away" from one another in that the spacing D31 is larger than any of the spacings D11, D21, D41, and D51, whereas the second and third SFIT electrodes 510b and 510c curve "toward" one another in that the spacing D32 is smallest among the spacings D3j. Also, in this example, the first and third SFIT electrodes 510a and 510c curve in the same direction, and the second, fourth, and fifth SFIT electrodes 510b, 510d, and 510e curve in the same direction and opposite to the direction of curvature of the first and third SFIT electrodes. The directions of curvature of the SFIT electrodes 510a-e may be varied depending on the design objectives, and embodiments are not limited to the arrangement shown in FIG. 10A. In addition, each of the spacings Dij may be individually selected to optimize the passing characteristic (in terms of frequency, amplitude, and phase) of the phase shift circuit for a given application. The spacings across different channels within a given SFIT electrode can be but need not be symmetric. For example, D11 may or may not be equal to D51, and D21 may or may not be equal to D41. The ability to individually select each of the spacings Dij provides great flexibility in the SFIT electrode design, allowing the phase shift circuit 420 to be configured to provide an excellent isolation characteristic in the duplexer 300, for example, even though the phase shift circuit 420 includes only a small number (e.g., one to five) of SFIT electrodes each having relatively few electrode fingers.

Further, as discussed above, in the case of an SFIT electrode 510 having curved electrode fingers 512, the amplitude characteristic of a phase shift circuit including the SFIT electrode(s) can be tailored by controlling the curvature of the electrode fingers 512. In a stepped profile design, such as shown in FIG. 10A, for example, the phase characteristic of the phase shift circuit that includes the SFIT electrode sub-system 530 similarly may be tailored by suitably adjusting the spacings Dij. In particular, different spacings can be used for different channels to "weight" the phase response at different frequencies, thereby controlling the overall phase characteristics of the phase shift circuit over the frequency band of interest. When such an SFIT electrode sub-system 530 is used in the phase shift circuit 420, the design flexibility offered by the SFIT electrodes allows precise tailoring of the frequency response of the phase shift circuit to achieve desired performance of the associated filter 400 or antenna duplexer 300.

Figure 11B:
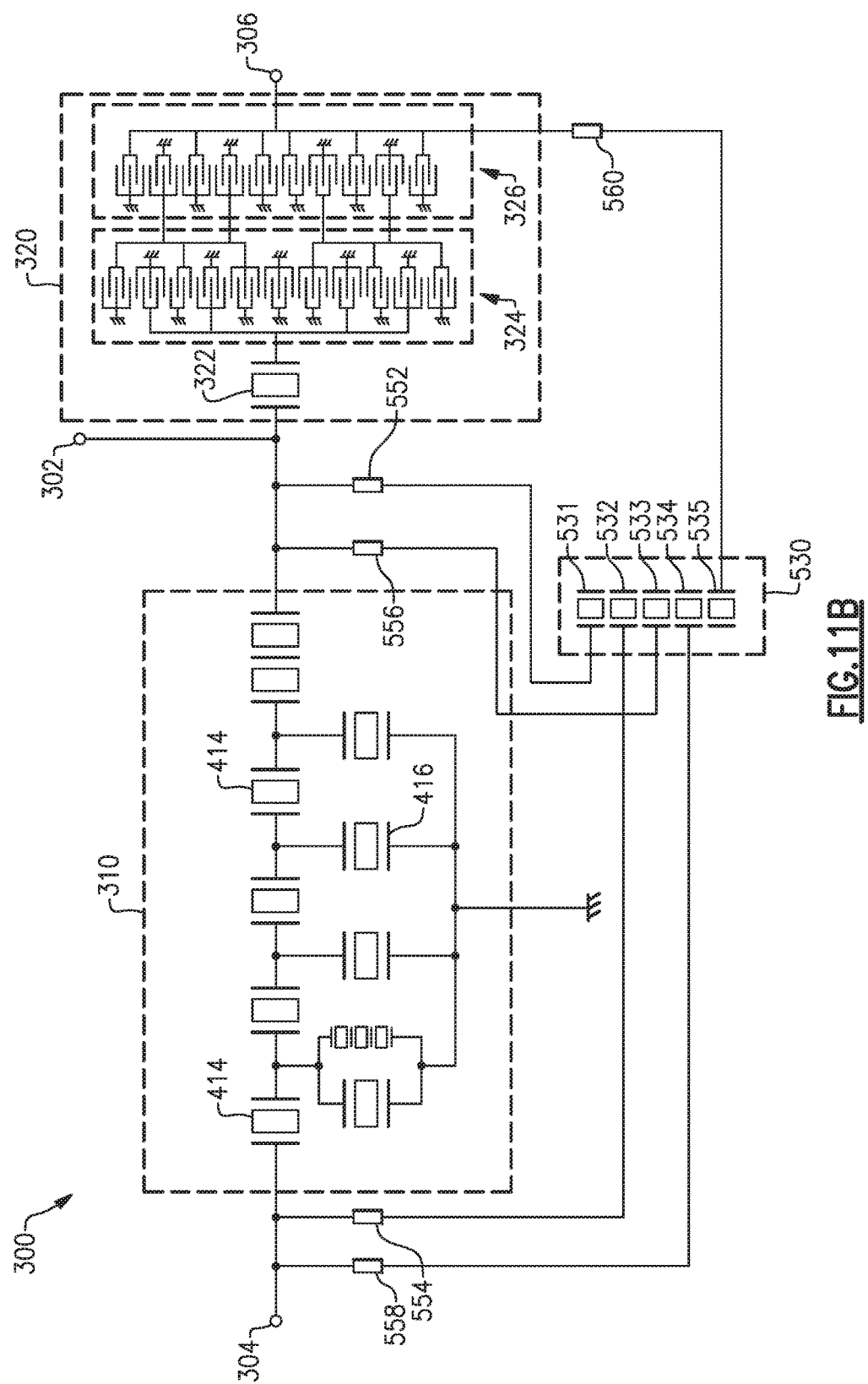
FIG. 11B is a diagram showing examples of the filter circuits in the antenna duplexer of FIG. 11A according to aspects of the present invention.

FIG. 11A is a diagram showing another example of the antenna duplexer 300 including an embodiment of a phase shift circuit that includes an example of the SFIT electrode assembly 530 having five SFIT electrodes. FIG. 11B shows particular examples of the transmission filter 310 and the reception filter 320; however, those skilled in the art will appreciate that the filters can have various configurations, not limited to the examples shown in FIG. 11B. In the illustrated example, the transmission filter 310 includes a plurality of series arm resonators 414 and parallel arm resonators 416 arranged as shown, and the reception filter 320 includes a two-terminal resonator 322, a first longitudinally coupled resonator 324, and a second longitudinally coupled resonator 326 that are connected in series between the common terminal 302 and the output terminal 306, as shown in FIG. 11B. In the examples shown in FIGS. 11A and 11B, the phase shift circuit includes a first capacitor 552 connected between a first SFIT electrode 531 and the common terminal 302, a second capacitor 554 connected between a second SFIT electrode 532 and the input terminal 304, a third capacitor 556 connected between a third SFIT electrode 533 and the common terminal 302, a fourth capacitor 558 connected between a fourth SFIT electrode 534 and the input terminal, and a fifth capacitor 560 connected between a fifth SFIT electrode 535 and the output terminal 306.

Figure 10B:
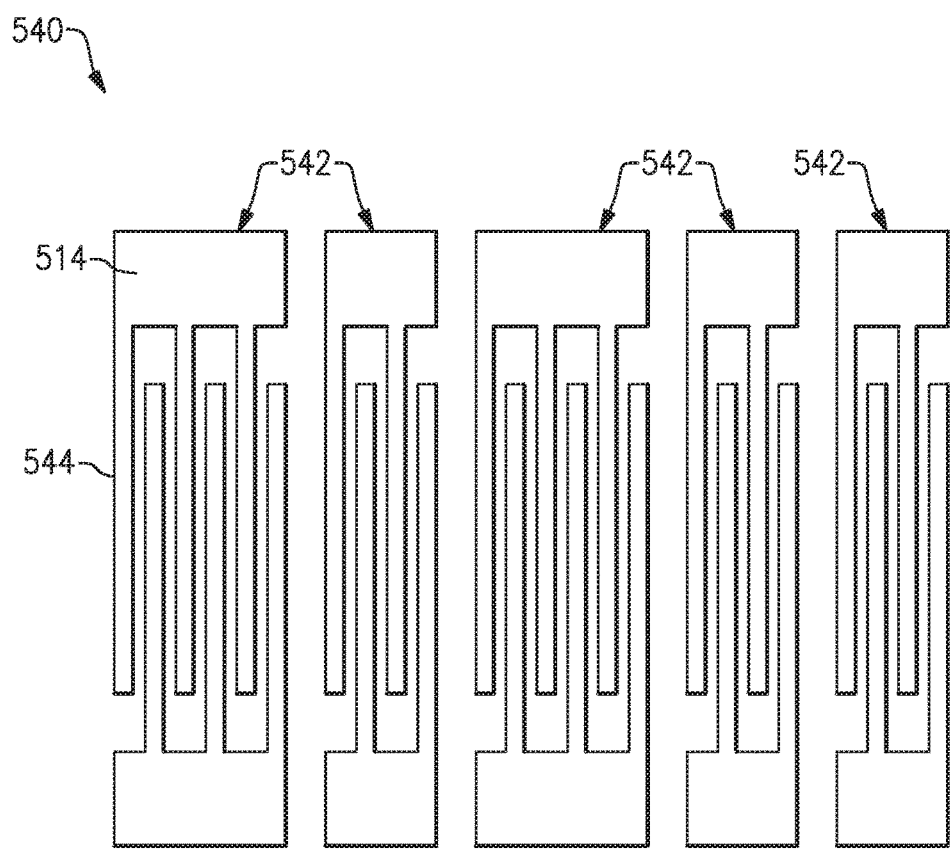
FIG. 10B is a diagram of a comparative example of an IDT electrode assembly including five conventional IDT electrodes.
Figure 12:
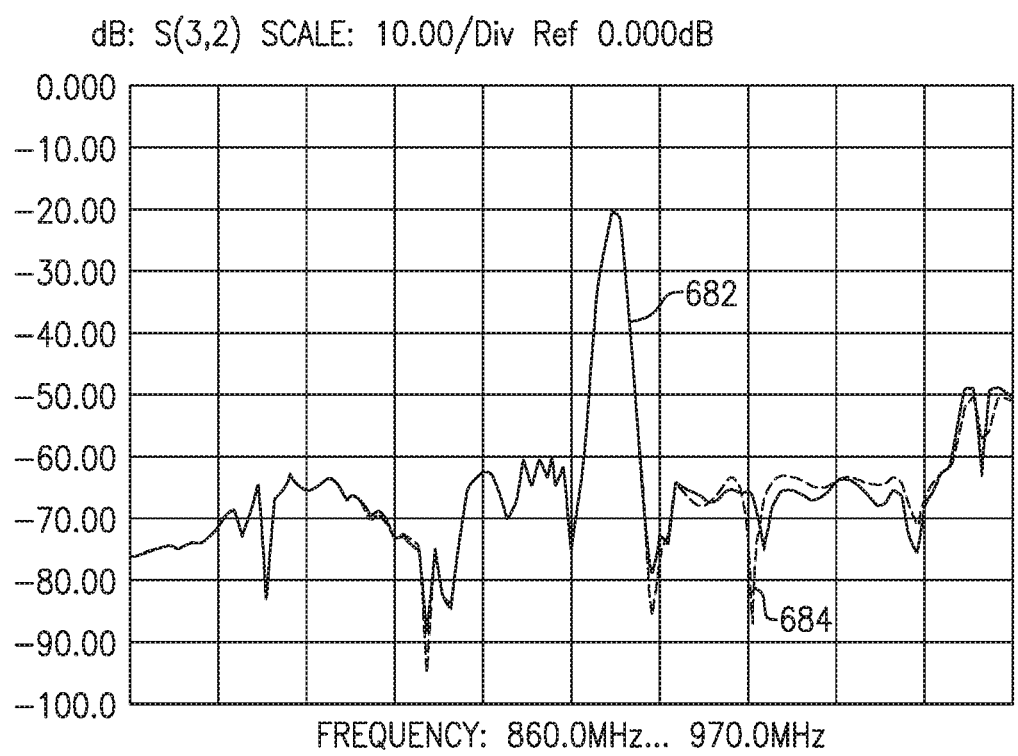
FIG. 12 is a graph showing simulated isolation characteristics for examples the antenna duplexer of FIG. 11B, according to aspects of the present invention.

FIG. 12 shows a simulated isolation characteristic measured between the input terminal 304 and the output terminal 306, S(3,2) for the example of the antenna duplexer 300 shown in FIG. 11B. In FIG. 12, the vertical axis represents the amplitude of the isolation characteristic (in dB), and the horizontal axis represents frequency (in MHz). Trace 682 represents the simulated isolation characteristic for the antenna duplexer 300 of FIG. 11B including the phase shift circuit in which the SFIT electrode assembly 530 has the arrangement shown in FIG. 10A. Trace 684 represents a comparative example in which the SFIT electrode assembly 530 is replaced with a conventional IDT arrangement as shown in FIG. 10B.

Figure 13:
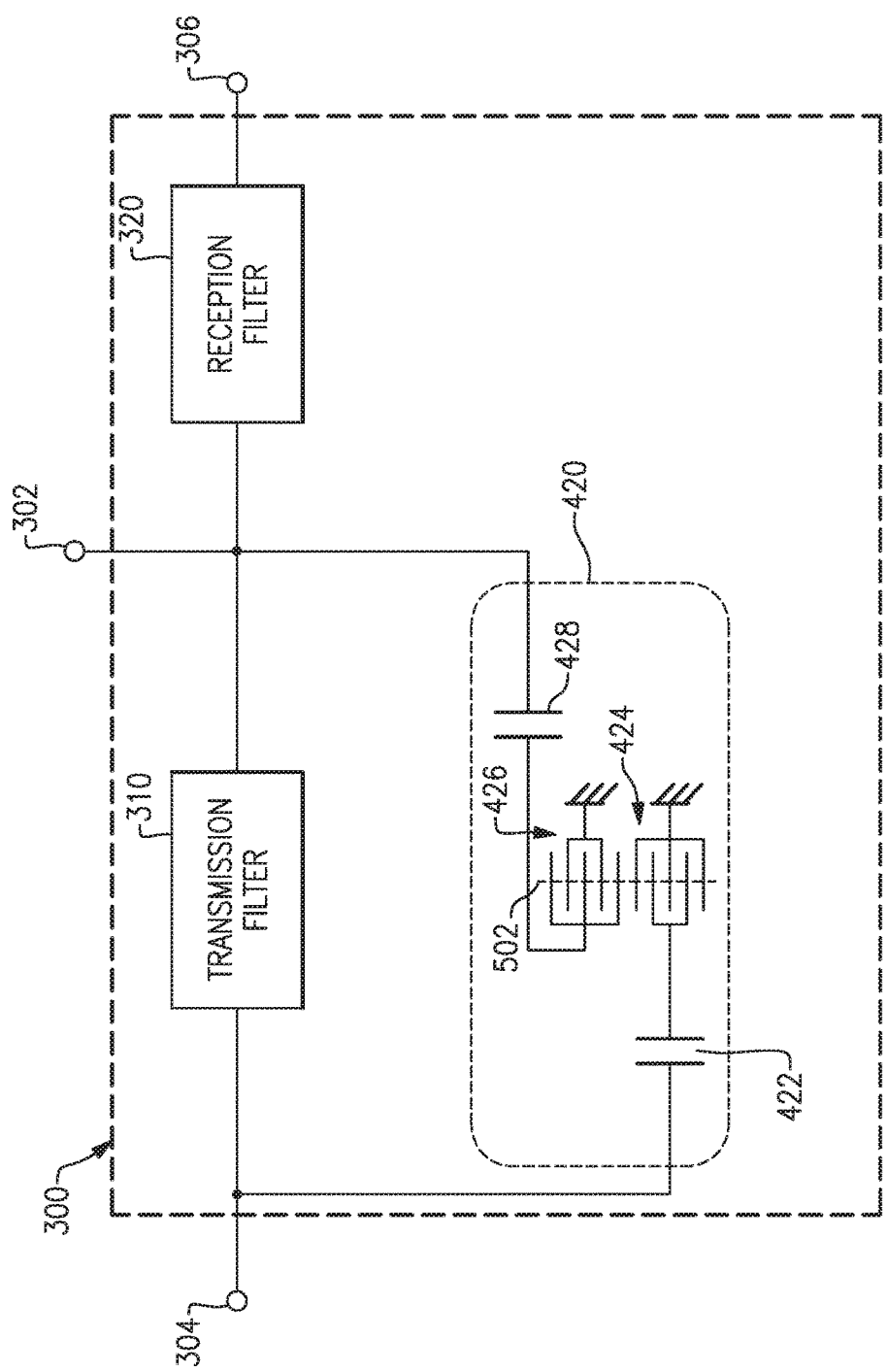
FIG. 13 is a diagram of another example of an antenna duplexer including a phase shift circuit connected in parallel with the transmission circuit according to aspects of the present invention.

Thus, aspects and embodiments provide a phase shift circuit 420 implemented using two or more SFIT electrodes, the phase shift circuit being configured to complement the frequency response of an associated filter circuit, so as to achieve improved performance in an electronic device in which the filter circuit and phase shift circuit are used. In particular, as discussed above, in certain embodiments the phase shift circuit 420 can be used in connection with the transmission filter 310 or reception filter 320 in an antenna duplexer 300. FIG. 13 is a diagram of an example of the antenna duplexer 300 including an embodiment of phase shift circuit 420 connected in parallel with the transmission filter 310 between the input terminal 304 and the common terminal 302. In one example the transmission filter 310 has the configuration of the main filter circuit 410 shown in FIG. 3B; however, as discussed above, numerous other configurations of the transmission filter can be implemented. Similarly, the reception filter 320 can be implemented using longitudinally-coupled resonators (as shown, for example, in FIGS. 7 and 11B), ladder-type filter arrangements, or any other suitable filter configuration. The exact configurations of the transmission filter 310 and reception filter 320 may depend, for example, on the expected frequency range(s) of operation, or other performance or design specifications, such as the "sharpness" of the transition between the passbands and stopbands, tolerable "ripple" in the passbands or stopbands, or other factors. Using SFIT electrodes in the phase shift circuit 420 provides a high degree of design flexibility, in particular, in the phase shape and amplitude characteristics of the frequency response over a relatively wide range of frequencies, to allow desired performance specifications to be met for a wide variety of different transmission or reception filter configurations. As discussed above, the phase shift circuit 420 implemented using two or more SFIT electrodes allows for the auxiliary signal output from the phase shift circuit to be tailored to have an amplitude and phase that effectively cancels at least a portion of the main signal travelling between the input terminal 304 and the output terminal 306, thereby significantly attenuating this signal and reducing the undesired leakage between these two terminals and improving the isolation characteristic of the antenna duplexer 300.

Embodiments of the antenna duplexer 300 or filter 400, with the phase shift circuit 420 implemented using SFIT electrodes, as discussed above, may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), an appliance, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a wrist watch, a clock, etc. Further, the electronic devices can include unfinished products.

Figure 14:
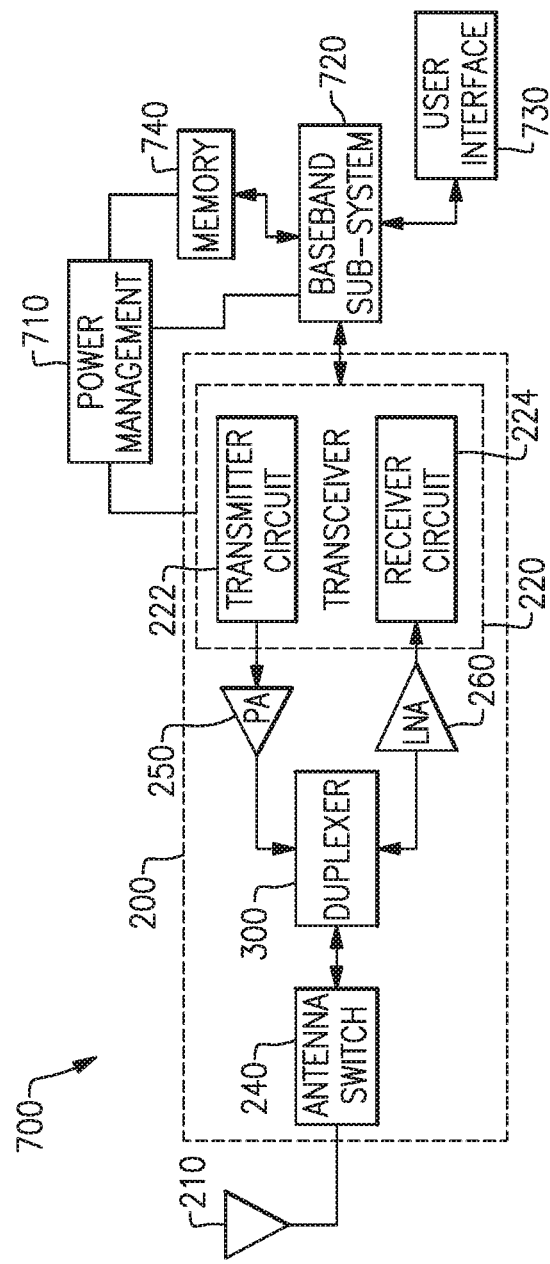
FIG. 14 is a block diagram of one example of an electronic device including an antenna duplexer according to aspects of the present invention.

FIG. 14 is a block diagram of one example of a wireless device 700 including the antenna duplexer 300 which includes the filter 400 having the phase shift circuit 420 implemented using SFIT electrodes according to certain embodiments. The wireless device 700 can be a cellular phone, smart phone, tablet, modem, communication network or any other portable or non-portable device configured for voice or data communication. The wireless device 700 can receive and transmit signals from the antenna 210. The wireless device includes the front-end module 200, which includes the duplexer 300 as discussed above. The front-end module 200 further includes an antenna switch 240, which can be configured to switch between different frequency bands or modes, such as transmit and receive modes, for example. In the example illustrated in FIG. 14, the antenna switch 240 is positioned between the duplexer 300 and the antenna 210; however, in other examples the duplexer 300 can be positioned between the antenna switch 240 and the antenna 210, or the antenna switch 240 and the duplexer 300 can be integrated into a single module.

The front end module 200 includes a transceiver 220 that is configured to generate signals for transmission or to process received signals. The transceiver can include the transmitter circuit 222 which can be connected to the input terminal 304 of the duplexer 300, and the receiver circuit 224 which can be connected to the output terminal 306 of the duplexer 300, as shown in FIG. 2. Signals generated for transmission by the transmitter circuit 222 are received by a power amplifier (PA) module 250, which amplifies the generated signals from the transceiver 220. As will be appreciated by those skilled in the art, the power amplifier module 250 can include one or more power amplifiers. The power amplifier module 250 can be used to amplify a wide variety of RF or other frequency-band transmission signals. For example, the power amplifier module 250 can receive an enable signal that can be used to pulse the output of the power amplifier to aid in transmitting a wireless local area network (WLAN) signal or any other suitable pulsed signal. The power amplifier module 250 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 250 and associated components including switches and the like can be fabricated on GaAs substrates using, for example, pHEMT or BiFET transistors, or on a Silicon substrate using CMOS transistors. The front-end module 200 further includes a low noise amplifier module 260, which amplifies received signals from the antenna 210 and provides the amplified signals to the receiver circuit 224 of the transceiver 220.

The wireless device 700 of FIG. 14 further includes a power management sub-system 710 that is connected to the transceiver 220 and that manages the power for the operation of the wireless device. The power management system 710 can also control the operation of a baseband sub-system 720 and other components of the wireless device 700. The power management system 710 can include, or can be connected to, a battery (not shown) that supplies power for the various components of the wireless device 700. The power management system 710 can further include one or more processors or controllers that can control the transmission of signals, for example.

In one embodiment, the baseband sub-system 720 is connected to a user interface 730 to facilitate various input and output of voice or data provided to and received from the user. The baseband sub-system 720 can also be connected to a memory 740 that is configured to store data or instructions to facilitate the operation of the wireless device 700, or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A filter comprising:
   an input terminal;
   an output terminal;
   a main filter circuit connected between the input terminal and the output terminal, the main filter circuit having a first phase characteristic, a first passband, and a first stopband; and
   a phase shift circuit connected in parallel with the main filter circuit between the input terminal and the output terminal, the phase shift circuit including a first capacitor element, a second capacitor element, a pair of acoustic wave elements connected in series between the first capacitor element and the second capacitor element, and at least one additional acoustic wave element connected in series with the pair of acoustic wave elements, the pair of acoustic wave elements including a pair of slanted-finger interdigitated transducer electrodes disposed apart from each other on a single acoustic wave path along which acoustic waves propagate through the acoustic wave elements, the at least one additional acoustic wave element including a slanted-finger interdigital transducer electrode, and the phase shift circuit having a second phase characteristic that is opposite to the first phase characteristic in an attenuation band that corresponds to at least a portion of the first stopband.

2. The filter of claim 1 wherein each slanted-finger interdigitated transducer electrode includes first and second comb-shaped electrodes that interdigitate with one another, each of the first and second comb-shaped electrodes having a plurality of electrode fingers, and each electrode finger having a curved shape.

3. The filter of claim 1 wherein each slanted-finger interdigitated transducer electrode of the pair of slanted-finger interdigitated transducer electrodes includes first and second comb-shaped electrodes that interdigitate with one another, each of the first and second comb-shaped electrodes having a busbar and a plurality of slanted electrode fingers that extend from the busbar at an angle not equal to 90 degrees.

4. The filter of claim 1 wherein the main filter circuit includes a plurality of filter resonators, the pair of acoustic wave elements of the phase shift circuit and the plurality of filter resonators being formed on a single common piezoelectric substrate.

5. The filter of claim 4 wherein the plurality of filter resonators of the main filter circuit includes a plurality of series arm filter resonators connected in series with one another along a signal line that connects the input terminal and the output terminal, and a plurality of parallel arm filter resonators connected between the signal line and a reference potential, the plurality of series arm filter resonators and the plurality of parallel arm filter resonators together forming a ladder-circuit.

6. The filter of claim 5 wherein the plurality of series arm filter resonators and the plurality of parallel arm filter resonators are surface acoustic wave resonators.

7. The filter of claim 5 wherein the plurality of series arm filter resonators and the plurality of parallel arm filter resonators are bulk acoustic wave resonators.

8. The filter of claim 1 wherein the first capacitor element is connected between the pair of acoustic wave elements and the input terminal, and the second capacitor element is connected between the pair of acoustic wave elements and the output terminal, a first capacitance of the first capacitor element being smaller than a second capacitance of the second capacitor element.

9. A duplexer comprising:
an input terminal;
an output terminal;
a common terminal;
a filter circuit including a transmission filter connected between the input terminal and the common terminal, and a reception filter connected between the common terminal and the output terminal such that the transmission and reception filters are connected in series between the input terminal and the output terminal, the transmission filter having a first passband and a first stopband, and the reception filter having a second passband different from the first passband and at least partially overlapping the first stopband; and
a phase shift circuit connected in parallel with the transmission filter between the input terminal and the common terminal, the phase shift circuit including a first capacitor element, a second capacitor element, a first slanted-finger interdigitated transducer electrode, a second slanted-finger interdigitated transducer electrode, and a third slanted-finger interdigitated transducer electrode, the phase shift circuit having a first phase characteristic that is opposite to a second phase characteristic of the transmission filter in an attenuation band, the attenuation band being within the first stopband and within the second passband.

10. The duplexer of claim 9 wherein each of the first, second, and third slanted-finger interdigitated transducer electrodes includes a pair of comb-shaped electrodes having a plurality of electrode fingers that interdigitate with one another, each electrode finger having a curved shape.

11. The duplexer of claim 9 wherein the first, second, and third slanted-finger interdigitated transducer electrodes are disposed on a piezoelectric substrate spaced apart from each other along a single acoustic wave path along which acoustic waves propagate through the first, second, and third slanted-finger interdigitated transducer electrodes.

12. The duplexer of claim 11 wherein the transmission filter includes a plurality of filter resonators disposed on the piezoelectric substrate.

13. The duplexer of claim 12 wherein the plurality of filter resonators includes a plurality of series arm filter resonators connected in series with one another along a signal line that connects the input terminal and the common terminal, and a plurality of parallel arm filter resonators connected between the signal line and a reference potential, the plurality of series arm filter resonators and the plurality of parallel arm filter resonators together forming a ladder-circuit.

14. The duplexer of claim 13 wherein the reference potential is ground.

15. The duplexer of claim 9 wherein the first capacitor element is connected between the first slanted-finger interdigitated transducer electrode and the input terminal and the second capacitor element is connected between the second slanted-finger interdigitated transducer electrode and the output terminal.

16. The duplexer of claim 15 wherein a first capacitance of the first capacitor element is smaller than a second capacitance of the second capacitor element.

17. The duplexer of claim 9 further comprising an inductor connected between the common terminal and ground.

18. The duplexer of claim 9 wherein each of the first and second slanted-finger interdigitated transducer electrodes includes a pair of comb-shaped electrodes that interdigitate with one another, each comb-shaped electrode having a plurality of electrode fingers that extend from a busbar at an angle not equal to 90 degrees.

* * * * *